US008686813B2

(12) United States Patent
Deal et al.

(10) Patent No.: US 8,686,813 B2
(45) Date of Patent: Apr. 1, 2014

(54) MONOLITHICALLY INTEGRATED ACTIVE ELECTRONIC CIRCUIT AND WAVEGUIDE STRUCTURE FOR TERAHERTZ FREQUENCIES

(75) Inventors: William Roland Deal, Manhattan Beach, CA (US); Kevin Masaru Kung Hoong Leong, Los Angeles, CA (US); Vesna Radisic, Manhattan Beach, CA (US); Patty Pei-Ling Chang-Chien, Redondo Beach, CA (US); Richard Lai, Redondo Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 1181 days.

(21) Appl. No.: 12/584,075

(22) Filed: Aug. 29, 2009

(65) Prior Publication Data

US 2011/0050371 A1    Mar. 3, 2011

(51) Int. Cl.
*H01P 1/00* (2006.01)
*H01P 1/213* (2006.01)

(52) U.S. Cl.
USPC ............................................ 333/248; 333/250

(58) Field of Classification Search
USPC .................. 333/239, 248, 208, 250
See application file for complete search history.

(56) References Cited

U.S. PATENT DOCUMENTS

| | | | |
|---|---|---|---|
| 5,736,908 A * | 4/1998 | Alexanian et al. | 333/125 |
| 7,292,125 B2 * | 11/2007 | Mansour et al. | 333/258 |
| 7,543,999 B2 | 6/2009 | Winter et al. | |
| 2007/0047869 A1 * | 3/2007 | Hsu | 385/14 |

OTHER PUBLICATIONS

Becker, James P. et al., "Toward a Novel Planar Circuit Compatible Silicon Micromachined Waveguide" Electrical Performance of Electronic Packaging, Oct. 25-27, 1999, pp. 221-222.
Belohoubek, E. et al., "30-Way Radial Power Combiner for Miniature GaAs FET Power Amplifiers", International Microwave Symposium Digest, MTT-S, vol. 86, Issue 1, Jun. 2, 1986.
George, Paul A. et al., "Integrated Waveguide-Coupled Terahertz Microcavity Resonators", Applied Physics Letters, vol. 91, Issue 19, Nov. 2007, pp. 191122-1-191122-3.
Lubecke, Victor M. et al., "Micromachining for Terahertz Applications" IEEE Transactions on Microwave Theory and Techniques, vol. 46, No. 11, Nov. 1998, pp. 1821-1831.
Schur,J.,"Micromachined Split-block Schottky-Diode . . . " Conf. Digest Joint 29th Inter.Conf. Infrared & Millimeter Waves 12th Inter. Conf. Terahertz Electronics,2004,p. 325-326.
Wanke,Michael "Integration of Terahertz Quantum Cascade Lasers with Lithographically Micromachined Waveguides" 33rd Inter.Conf. Infrared,Millimeter & Terahertz Waves,2008,p. 1-1.

* cited by examiner

*Primary Examiner* — Dean O Takaoka
*Assistant Examiner* — Alan Wong
(74) *Attorney, Agent, or Firm* — Carmen Patti Law Group, LLC

(57) ABSTRACT

An electronic system. The electronic system includes a waveguide structure having a first waveguide-coupling point and a second waveguide-coupling point and an active electronic circuit having a first circuit-coupling point and a second circuit-coupling point. The second waveguide-coupling point is coupled to the first circuit-coupling point; the system is capable of receiving an input signal at the first waveguide-coupling point and transmitting an output signal at the second circuit-coupling point and/or receiving the input signal at the second circuit-coupling point and transmitting the output signal at the first waveguide-coupling point; the input signal and the output signal have frequencies in a terahertz frequency range; and the system is fabricated as a monolithic integrated structure having the waveguide structure fabricated by micromachining and the circuit fabricated monolithically.

14 Claims, 23 Drawing Sheets

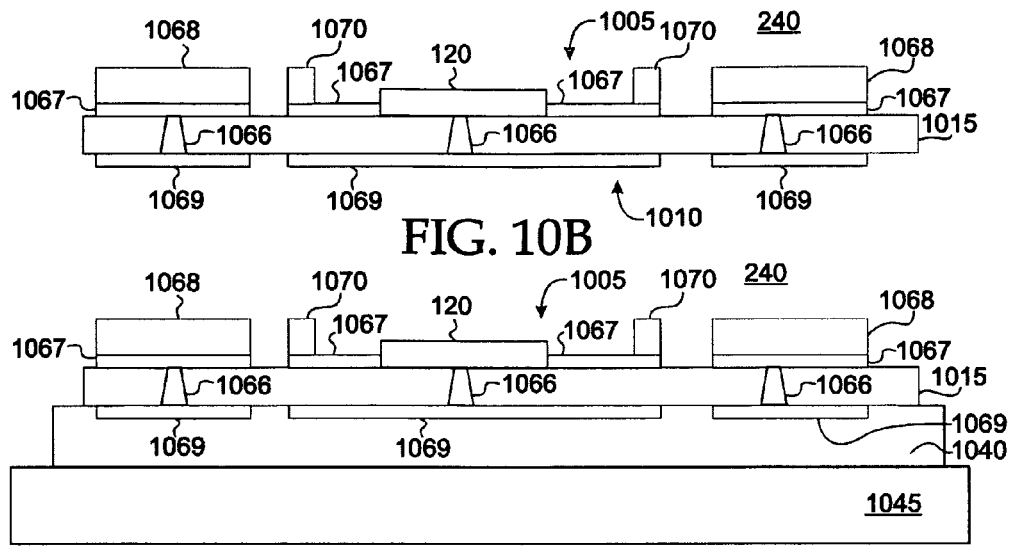
FIG. 10B
FIG. 10C
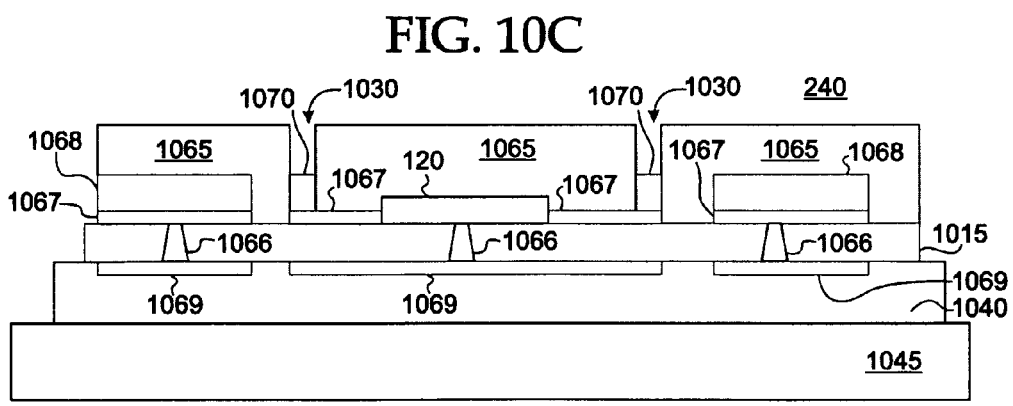
FIG. 10D
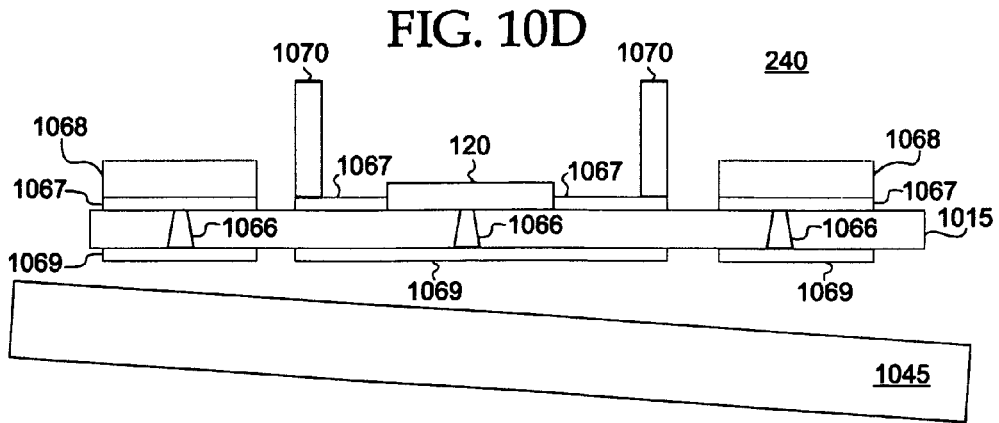
FIG. 10E

MONOLITHICALLY INTEGRATED ACTIVE ELECTRONIC CIRCUIT AND WAVEGUIDE STRUCTURE FOR TERAHERTZ FREQUENCIES

BACKGROUND

There is increasing interest in using terahertz (THz) radiation for applications in various fields including medical imaging, security, scientific investigations, imaging, communications, and manufacturing. Terahertz radiation refers to electromagnetic waves in the terahertz frequency range. The terahertz frequency range as referred to herein generally identifies those frequencies lying nominally between approximately 200 gigahertz and approximately 3 terahertz.

Systems that emit terahertz radiation could be effective medical diagnostic and research tools since, unlike X-rays, terahertz radiation generally will not damage biological tissues due to its non-ionizing nature. Terahertz radiation can also be used at airports and other areas for the detection of concealed weapons as it can penetrate fabrics and plastics. Terahertz radiation could be used in spectroscopic investigations in the fields of chemistry and biochemistry among others. Such radiation could be used in telecommunications above altitudes where water vapor in the air would cause signal absorption. Since plastics and cardboard are transparent at terahertz frequencies, such radiation has been proposed for inspecting packaged goods for process and quality control in some manufacturing environments.

Systems that emit and receive electromagnetic waves at terahertz frequencies have limited availability due to alignment and precision difficulties of machined waveguides and interconnect losses associated with attaching active electronic circuitry to terahertz waveguide components. The manufacturing of these systems is cost restrictive, and manufacturing volume is very low.

BRIEF DESCRIPTION OF THE DRAWINGS

The accompanying drawings provide visual representations which will be used to more fully describe various representative embodiments and can be used by those skilled in the art to better understand the representative embodiments disclosed herein and their inherent advantages. In these drawings, like reference numerals identify corresponding elements.

FIG. 10B is a side view of the circuit layer following process steps that patterned and etched the back side conductive layer on the circuit second side of the circuit substrate for the radial power combiner of FIG. 3.

FIG. 10C is a side view of the circuit layer following bonding the circuit substrate to a circuit carrier for the radial power combiner of FIG. 3.

FIG. 10D is a side view of the circuit layer following a photoresist layer patterning for the radial power combiner of FIG. 3.

FIG. 10E is a side view of the circuit layer following an additional plating process, a photoresist strip process, and demounting the circuit carrier for the radial power combiner of FIG. 3.

DETAILED DESCRIPTION

Figure 1:
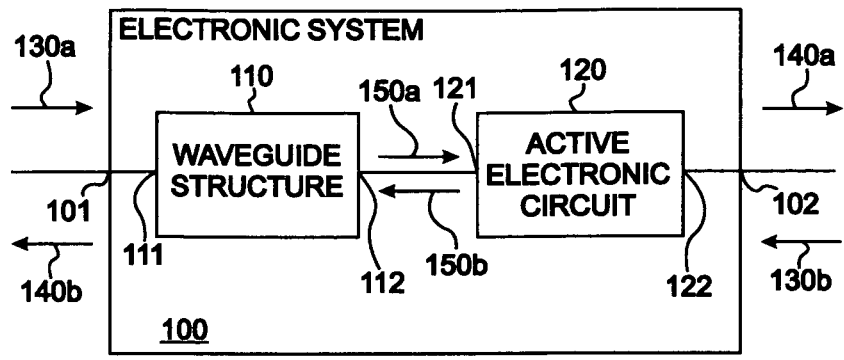
FIG. 1 is a block diagram of an electronic system as described in various representative embodiments.

As shown in the drawings for purposes of illustration, novel techniques are disclosed herein for electronic systems fabricated by monolithically integrating active electronic circuits and micromachined waveguide components. Such electronic systems are miniaturized and have significantly better performance due to lower interconnect losses than would otherwise be achievable and provide capabilities not possible before at terahertz (THz) frequencies. Such systems can be fabricated using wafer batch process technologies with resultant reduction in system cost and interconnection losses.

Previously, electronic systems that combine active electronic circuitry and machined waveguide structures have been fabricated using die-attach methods to attach the active circuits to the waveguide structures. Mass fabrication of such systems is practical only at frequencies lower than that of terahertz frequencies as their dimensions at terahertz frequencies are too small for use of these attachment techniques. Moreover, the extremely small dimensions of the machined waveguide makes it impractical to yield complex waveguide structures, due to precision limitations of machined waveguide tolerances. In addition, the connections between active electronic circuits and machined waveguides using these attachment techniques are too lossy to be used at terahertz frequencies. Electronic systems operable in the terahertz frequency range that monolithically integrate active electronic circuitry and waveguide structures have not been available.

While the present invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the following description and in the several figures of the drawings, like reference numerals are used to describe the same, similar or corresponding parts in the several views of the drawings.

Figure 2:
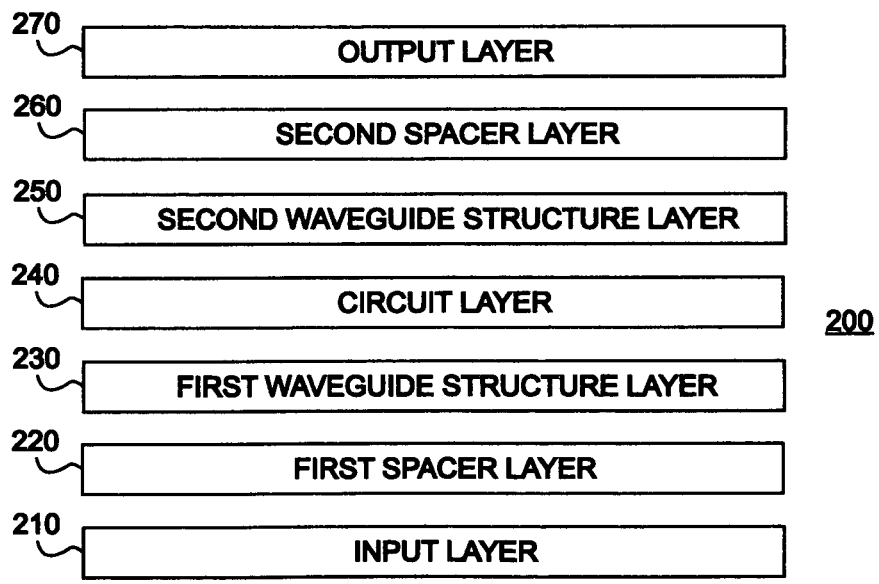
FIG. 2 is an exploded view of a block diagram of a monolithic integrated structure as described in various representative embodiments.

FIG. 1 is a block diagram of an electronic system 100 as described in various representative embodiments. In the representative embodiment of FIG. 1, the electronic system 100 comprises a waveguide structure 110 and an active electronic circuit 120. The electronic system 100 is fabricated as a monolithic integrated structure 200 having the waveguide structure 110 fabricated by micromachining and the circuit 120 fabricated monolithically. Refer to FIG. 2 for a representative embodiment of the monolithic integrated structure 200.

The electronic system 100 has a first system-coupling point 101 for input of a first input signal 130a and/or output of a second output signal 140b and a second system-coupling point 102 for output of first output signal 140a and/or input of a second input signal 130b. The waveguide structure 110 has a first waveguide-coupling point 111 and a second waveguide-coupling point 112, and the electronic circuit 120 has a first circuit-coupling point 121 and a second circuit-coupling point 122.

The first system-coupling point 101 is coupled to the first waveguide-coupling point 111; the second system-coupling point 102 is coupled to the second circuit-coupling point 122; and the second waveguide-coupling point 112 is coupled to the first circuit-coupling point 121.

In response to the first input signal 130a, a first internal signal 150a is transferred from the second waveguide-coupling point 112 to the first circuit-coupling point 121, and in response to the transferred first internal signal 150a, the first output signal 140a is transferred from the second circuit-coupling point 122 to the second system-coupling point 102. In response to the second input signal 130b, a second internal signal 150b is transferred from the first circuit-coupling point 121 to the second waveguide-coupling point 112, and in response to the transferred second internal signal 150b, the second output signal 140b is transferred from the first waveguide-coupling point 111 to the first system-coupling point 101.

In this representative embodiment, the input signals 130, the intermediate signals 150, and the output signals 140 have frequencies 610 in a terahertz frequency range. The terahertz frequency range as referred to herein generally identifies those frequencies lying nominally between approximately 200 gigahertz and approximately 3 terahertz.

FIG. 2 is an exploded view of a block diagram of a monolithic integrated structure 200 as described in various representative embodiments. In the following, a radial power combiner 300 will be disclosed in a representative example of the electronic system 100 fabricated as the monolithic integrated structure 200 of FIG. 2, wherein waveguide structures 110 are fabricated by micromachining and electronic circuits 120 are fabricated monolithically with a resultant monolithic integrated structure 200.

In the representative embodiment of FIG. 2, the monolithic integrated structure 200 comprises an input layer 210, a first spacer layer 220, a first waveguide structure layer 230, a circuit layer 240, a second waveguide structure layer 250, a second spacer layer 260, and an output layer 270.

The first spacer layer 220 overlays and is attached to the input layer 210; the first waveguide structure layer 230 overlays and is attached to the first spacer layer 220; the circuit layer 240 overlays and is attached to the first waveguide structure layer 230; the second waveguide structure layer 250 overlays and is attached to the circuit layer 240; the second spacer layer 260 overlays and is attached to the second waveguide structure layer 250; and the output layer 270 overlays and is attached to the second spacer layer 260. Various monolithically fabricated vias, pins, and metal traces are used to interconnect components on various layers with other components on other layers. In one representative example, the input layer 210 is fabricated on indium phosphide (InP); the first spacer layer 220 is fabricated on InP; the first waveguide structure layer 230 is fabricated on silicon (Si); the circuit layer 240 is fabricated on InP; the second waveguide structure layer 250 is fabricated on Si; the second spacer layer 260 is fabricated on InP; and the output layer 270 is fabricated on InP.

Figure 3:
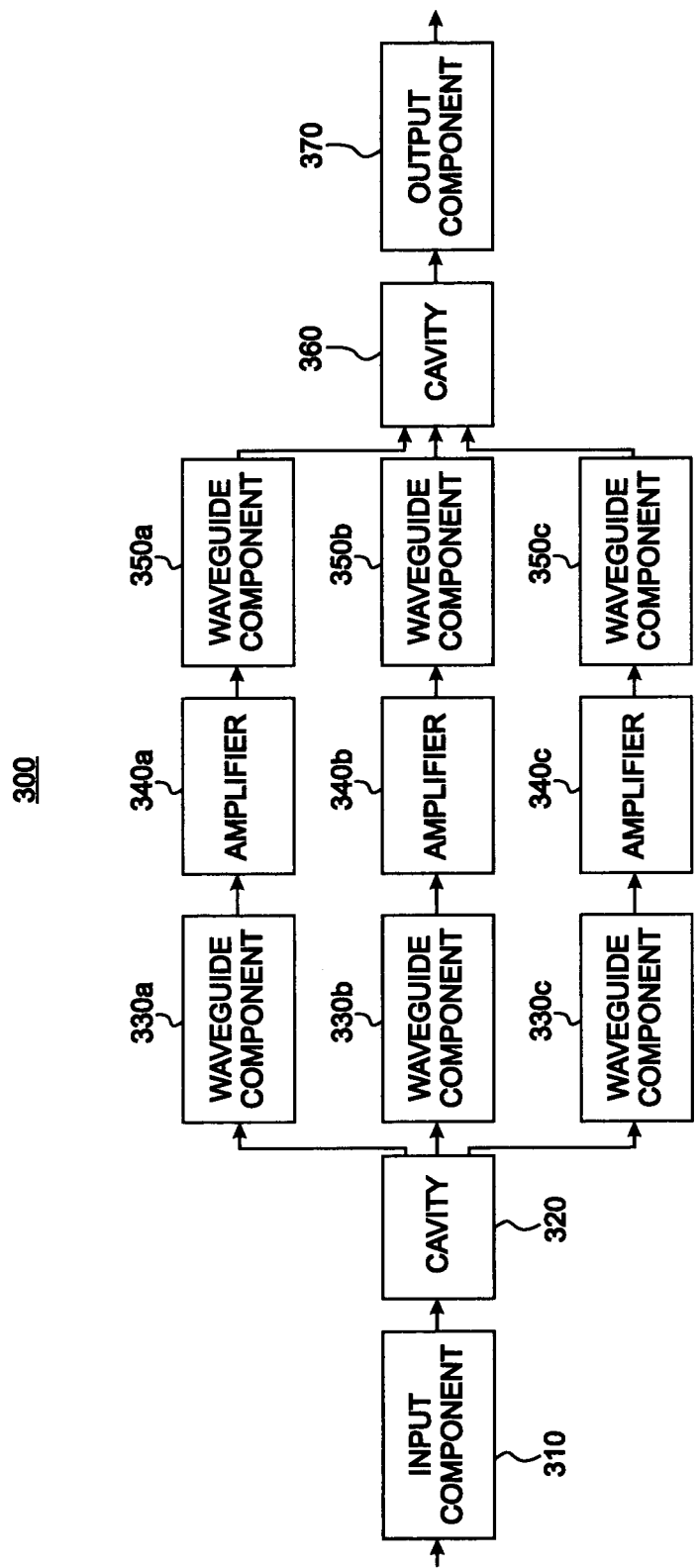
FIG. 3 is a block diagram of the radial power combiner as described in various representative embodiments.

FIG. 3 is a block diagram of the radial power combiner 300 as described in various representative embodiments. In the representative embodiment of FIG. 3, the radial power combiner 300 comprises an input component 310, a first waveguide cavity 320, multiple first waveguide components 330, multiple amplifier circuits 340, multiple second waveguide components 350, a second waveguide cavity 360, and an output component 370. The input component 310 receives an input signal at its input. The output of the input component 310 is coupled to the input at the center of the first waveguide cavity 320; separate signals in the first waveguide cavity 320 are coupled at separate radial points around the periphery of the first waveguide cavity 320 to each of the inputs of the multiple first waveguide components 330; the output of each of the multiple first waveguide components 330 is coupled to the input of a paired amplifier circuit 340; the output of each of the multiple amplifier circuits 340 is coupled to the input of a corresponding second waveguide component 350; the output of each of the multiple second waveguide components 350 are separately coupled to the second waveguide cavity 360 at separate radial points around the periphery of the second waveguide cavity 360; and the output of the second waveguide cavity 360 is coupled at the center of the second waveguide cavity 360 to the input of the output component 370. The input component 310 could be, for example, a transmission line or other appropriate reception component. The output component 370 could be, for example, an antenna or other appropriate transmission component.

Figure 4:
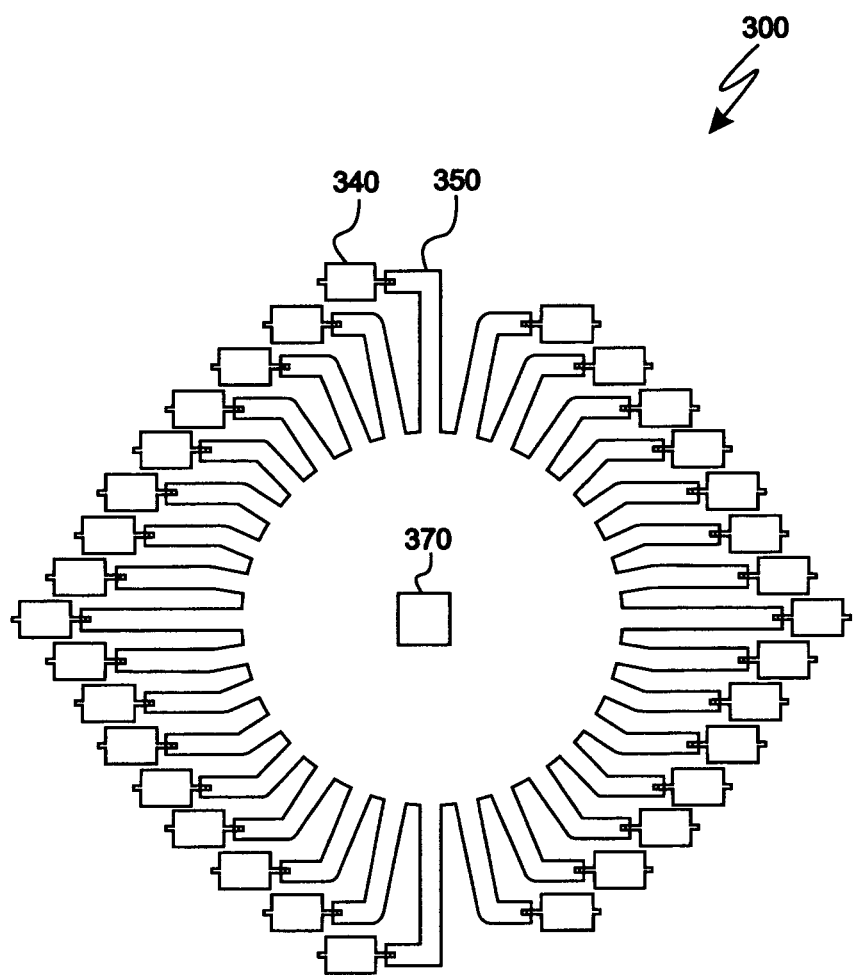
FIG. 4 is a top view of the radial power combiner of FIG. 3.

FIG. 4 is a top view of the radial power combiner 300 of FIG. 3. For ease and clarity of illustration, only certain elements in the radial power combiner 300 are shown in FIG. 4 and all elements shown, even those that would not be visible to the viewer, are shown with solid lines rather than with dashed lines. As shown in the representative embodiment of FIG. 4, the output component 370 is antenna 370 which is located in the output layer 270 shown in FIG. 2. Also shown are amplifier circuits 340 which are located in the circuit layer 240 and multiple second waveguide components 350 which are located in the second waveguide structure layer 250. Not shown in FIG. 4 are the second waveguide cavity 360 located in the second waveguide structure layer 250, the multiple first waveguide components 330 located in the first waveguide structure layer 230, the first waveguide cavity 320 located in the first waveguide structure layer 230, and the input component 310 located in the input layer 210, as well as the conducting traces and probes that couple features on one layer to features on another. In a representative example, the chip onto which the radial power combiner 300 could be in the range of 5 millimeters on a side, and the electronic amplifier circuits 120 could be in the range of 200 microns on a side.

Figure 5:
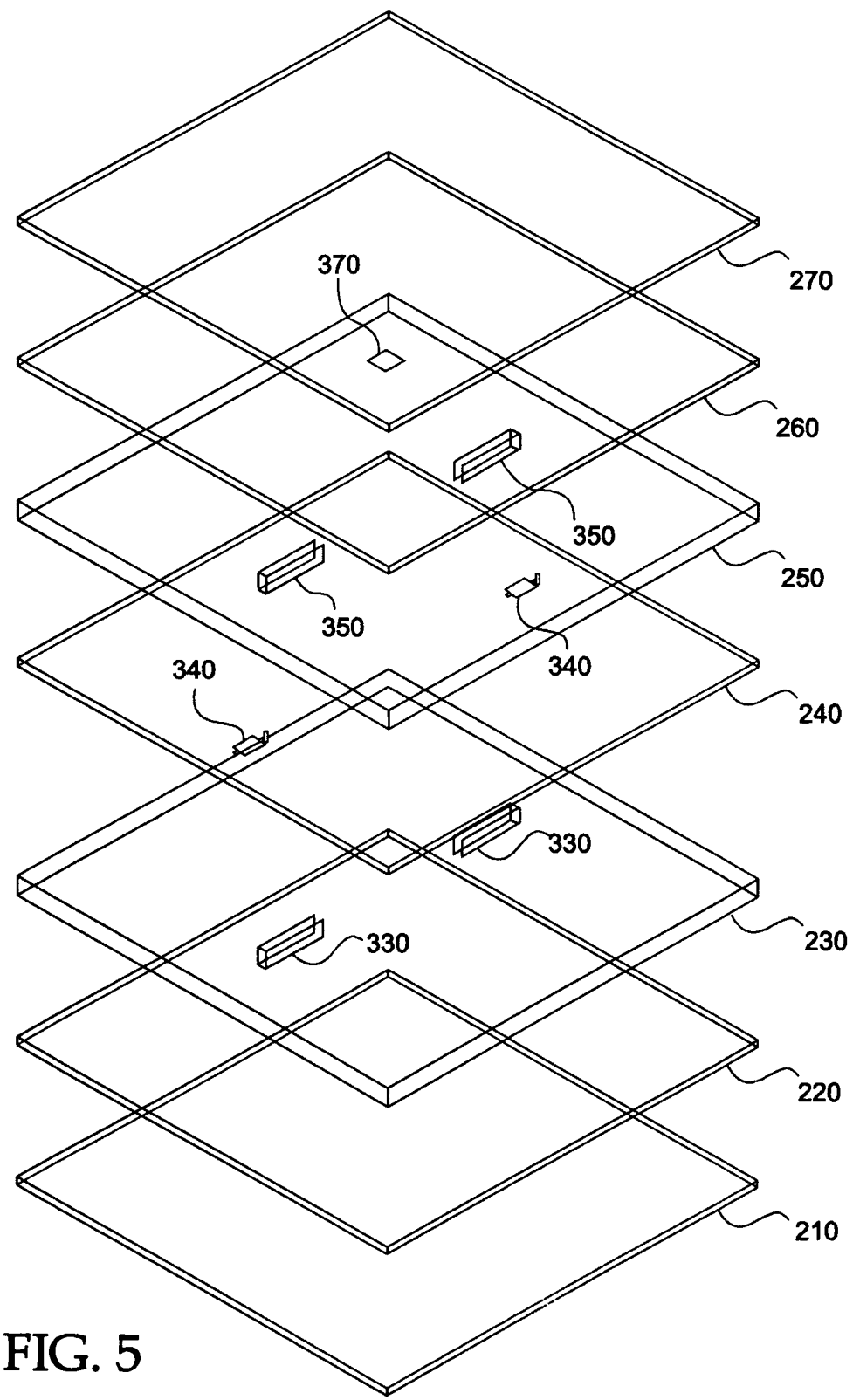
FIG. 5 is an exploded view of the radial power combiner of FIG. 3.

FIG. 5 is an exploded view of the radial power combiner 300 of FIG. 3. For ease and clarity of illustration, only certain elements in the radial power combiner 300 are shown in FIG. 5 and all elements shown, even those that would not be visible to the viewer, are shown with solid lines rather than with dashed lines. Only four of the first waveguide components 330, four of the amplifier circuits 340, four of the second waveguide components 350, and the output component 370 are shown in FIG. 5. The first waveguide cavity 320 which is not shown in FIG. 5 lies generally in the region between the four first waveguide components 330 in the first waveguide structure layer 230, and the second waveguide cavity 360 which is also not shown in FIG. 5 lies generally in the region between the four second waveguide components 350 in the second waveguide structure layer 250.

Figure 6A:
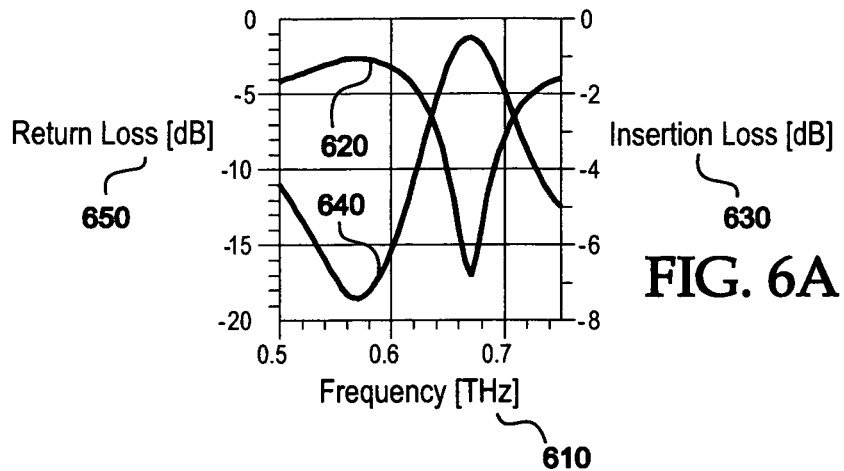
FIG. 6A is a graph of the results of a simulation for a first configuration of the radial power combiner of FIG. 3.

FIG. 6A is a graph of the results of a simulation for a first configuration of the radial power combiner 300 of FIG. 3. In FIG. 6A, the design of the radial power combiner 300 has been specified for operation at a frequency 610 of 670 gigahertz (GHz). At that frequency 610, the forward signal 620 has an insertion loss 630 of approximately 1 dB and the return signal 640 has a return loss 650 of approximately 17 dB. This simulation excludes any gain of the amplifier circuits 340. In the example of this simulation, the input layer 210 is fabricated on 15 micron thick InP; the first spacer layer 220 is fabricated on 35 micron thick InP; the first waveguide structure layer 230 is fabricated on 162 micron thick Si; the circuit layer 240 is fabricated on 15 micron thick InP; the second waveguide structure layer 250 is fabricated on 162 micron thick Si; the second spacer layer 260 is fabricated on 35 micron thick InP; and the output layer 270 is fabricated on 15 micron thick InP.

Figure 6B:
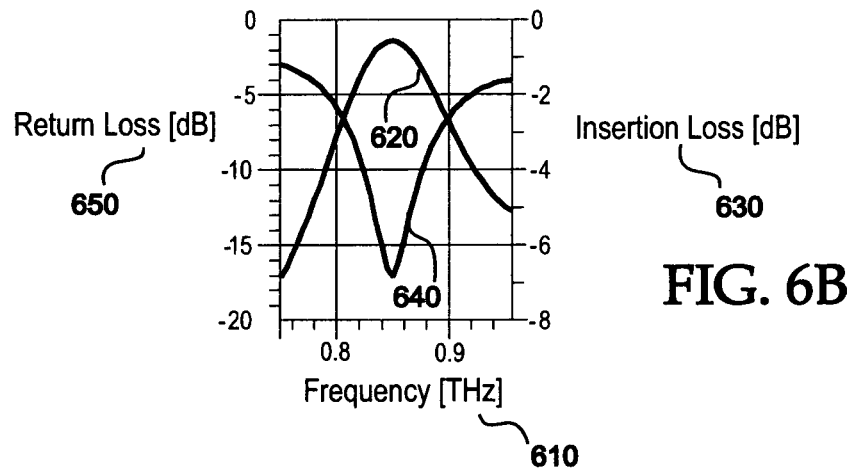
FIG. 6B is a graph of the results of a simulation for a second configuration of the radial power combiner of FIG. 3.

FIG. 6B is a graph of the results of a simulation for a second configuration of the radial power combiner 300 of FIG. 3. In FIG. 6B, the design of the radial power combiner 300 has been specified for operation at a frequency 610 of 850 GHz. At that frequency 610, the forward signal 620 has an insertion loss 630 of approximately 1 dB and the return signal 640 has a return loss 650 of approximately 17 dB. This simulation excludes any gain of the amplifier circuits 340.

Figure 6C:
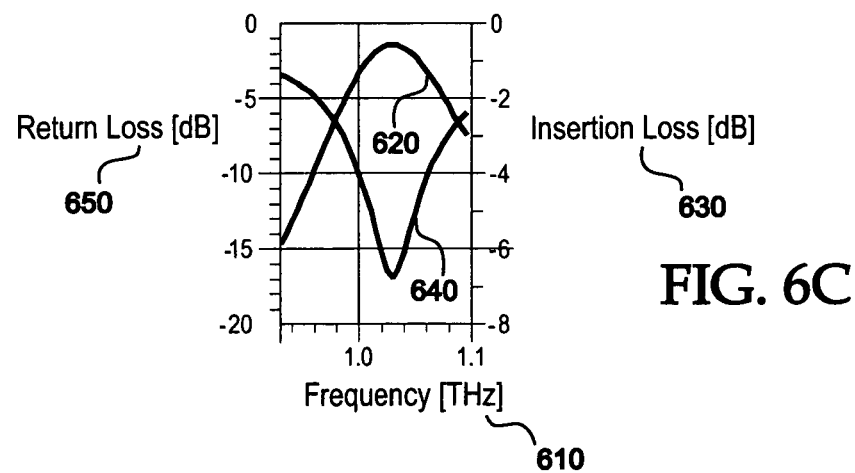
FIG. 6C is a graph of the results of a simulation for a third configuration of the radial power combiner of FIG. 3.

FIG. 6C is a graph of the results of a simulation for a third configuration of the radial power combiner 300 of FIG. 3. In FIG. 6C, the design of the radial power combiner 300 has been specified for operation at a frequency 610 of 1.03 THz. At that frequency 610, the forward signal 620 has an insertion loss 630 of approximately 1 dB and the return signal 640 has a return loss 650 of approximately 17 dB. This simulation excludes any gain of the amplifier circuits 340. In the example of this simulation, the input layer 210 is fabricated on 25 micron thick InP; the first spacer layer 220 is fabricated on 50 micron thick InP; the first waveguide structure layer 230 is fabricated on 150 micron thick Si; the circuit layer 240 is fabricated on 25 micron thick InP; the second waveguide structure layer 250 is fabricated on 150 micron thick Si; the second spacer layer 260 is fabricated on 50 micron thick InP; and the output layer 270 is fabricated on 25 micron thick InP.

Figure 7A:
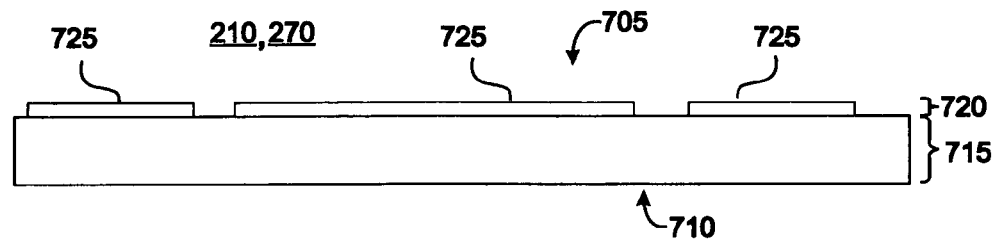
FIG. 7A is a side view of either the input layer or the output layer following the processing of a first conductive process for the radial power combiner of FIG. 3.
Figure 7B:
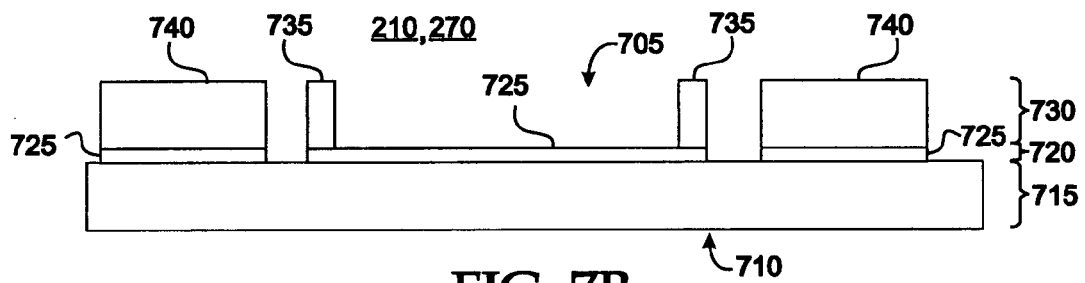
FIG. 7B is a side view of the input layer or the output layer following the processing of a second conductive process for the radial power combiner of FIG. 3.
Figure 7C:
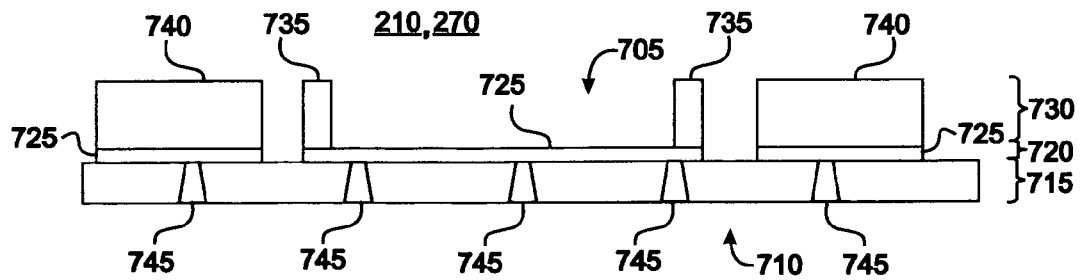
FIG. 7C is a side view of the input layer or the output layer following the processing of a first via process for the radial power combiner of FIG. 3.

FIGS. 7A-7C show the results following various processes on the input layer 210 or on the output layer 270 during processing for the radial power combiner 300 of FIG. 3. Processing for the input layer 210 is similar to that of processing for the output layer 270.

FIG. 7A is a side view of either the input layer 210 or the output layer 270 following the processing of a first conductive process for the radial power combiner 300 of FIG. 3. Either the input layer 210 or the output layer 270 has a first side 705 and a second side 710. The first conductive process could, for example, comprise the sub-processes of photoresist deposition, photoresist exposure through a photomask, photoresist cure, selective removal of part of the photoresist, metal etch, and strip of the remaining photoresist. The first conductive process is performed on the first side 705 of either the input layer 210 or the output layer 270. Following this processing, the input layer 210 or the output layer 270 comprises a first substrate 715 which could be InP or other appropriate conductive material and a first conductive layer 720 having first conductive pattern 725 which could be gold or other appropriate conductive material.

FIG. 7B is a side view of the input layer 210 or the output layer 270 following the processing of a second conductive process for the radial power combiner 300 of FIG. 3. The second conductive process could, for example, comprise the sub-processes of photoresist deposition, photoresist exposure through a photomask, photoresist cure, selective removal of part of the photoresist, metal deposition, and strip of the remaining photoresist. Following this processing, the input layer 210 or the output layer 270 comprises a first substrate 715, a first conductive layer 720 having first conductive pattern 725, and a second conductive layer 730 which could be gold or other appropriate conductive material having first conductive probes 735 for interconnecting to other layers in the radial power combiner 300 and first encapsulation shoulders 740 for at least partially encapsulating the radial power combiner 300.

FIG. 7C is a side view of the input layer 210 or the output layer 270 following the processing of a first via process for the radial power combiner 300 of FIG. 3. The first via process could, for example, comprise the sub-processes of photoresist deposition, photoresist exposure through a photomask, photoresist cure, photoresist, selective removal of part of the first substrate to form first vias 745, backfill of the first vias 745 with a conductive material and strip of the remaining photoresist. Planarization of the second side 710 may also be necessary. Following this processing, the input layer 210 or the output layer 270 comprises a first substrate 715, a first conductive layer 720 having first conductive pattern 725, a second conductive layer 730 having first conductive probes 735 for interconnecting to other layers in the radial power combiner 300 and first encapsulation shoulders 740 for at least partially encapsulating the radial power combiner 300, and first vias 745 for coupling signals to/from antennas, transmission lines, or other appropriate components.

Figure 8A:
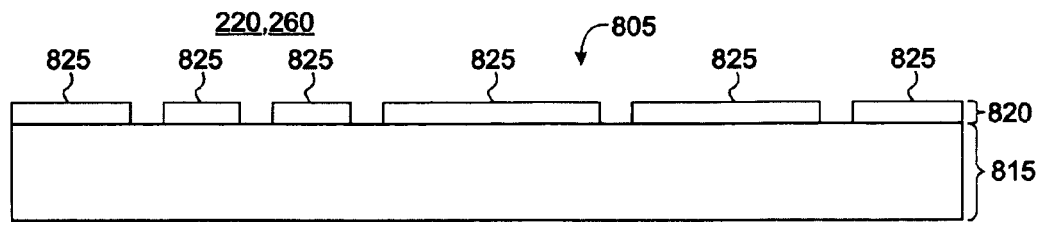
FIG. 8A is a side view of either the first spacer layer or the second spacer layer following the processing of patterning a barrier layer on either the first spacer layer or the second spacer layer of a spacer substrate for the radial power combiner of FIG. 3.
Figure 8B:
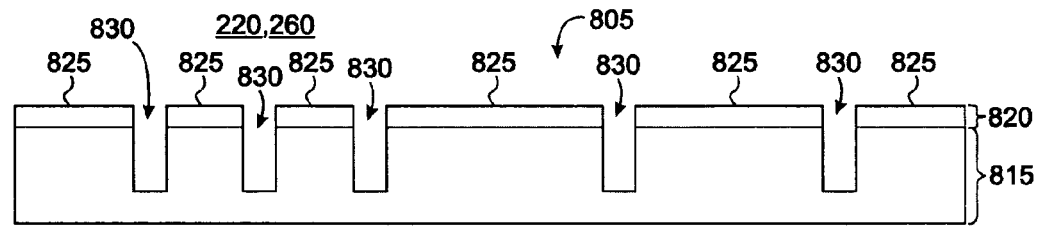
FIG. 8B is a side view of either the first spacer layer or the second spacer layer following the process of spacer substrate etching through openings in the barrier layer on either the first spacer layer or the second spacer layer for the radial power combiner of FIG. 3.
Figure 8C:
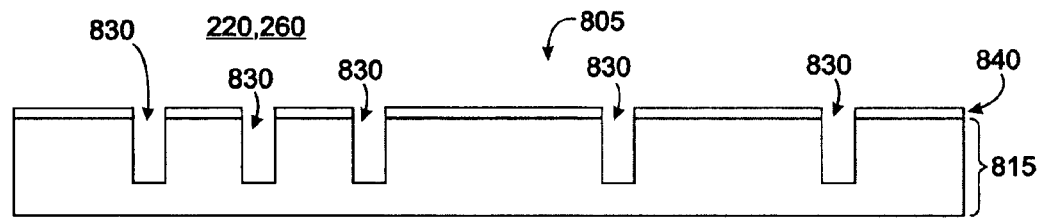
FIG. 8C is a side view of either the first spacer layer or the second spacer layer following the processes of bather layer strip and deposition of a bonding layer on top of the spacer substrate for the radial power combiner of FIG. 3.
Figure 8D:
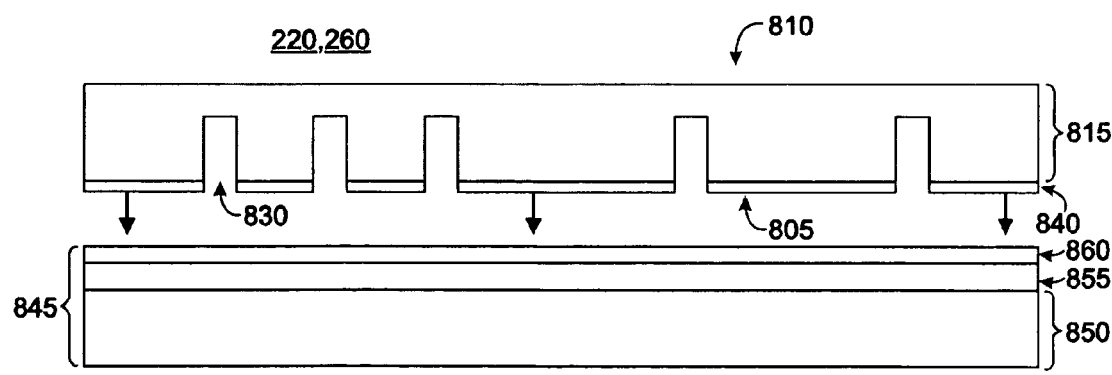
FIG. 8D is a flipped side view of either the first spacer layer or the second spacer layer following the processes of barrier layer strip and deposition of a bonding layer on top of the spacer substrate for the radial power combiner of FIG. 3.
Figure 8E:
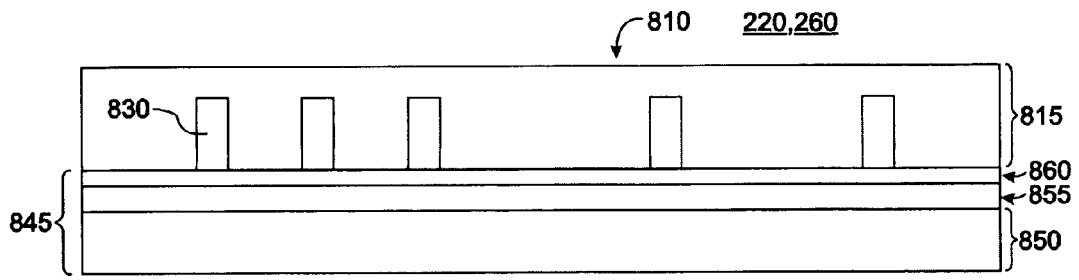
FIG. 8E is a flipped side view of either the first spacer layer or the second spacer layer following bonding to the spacer carrier for the radial power combiner of FIG. 3.
Figure 8F:
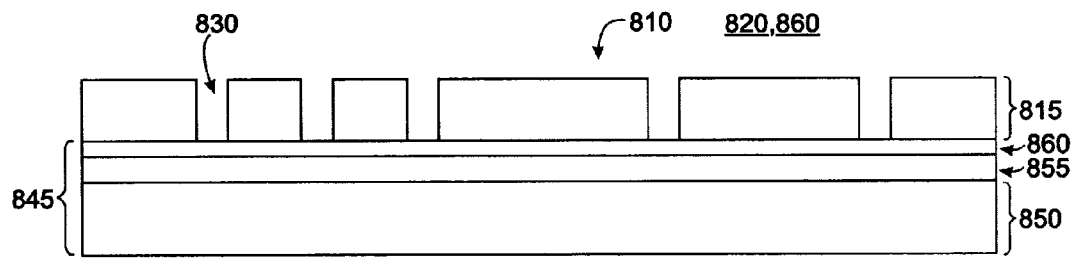
FIG. 8F is a flipped side view of either the first spacer layer or the second spacer layer bonded to the spacer carrier following a thinning of the spacer substrate for the radial power combiner of FIG. 3.
Figure 8G:
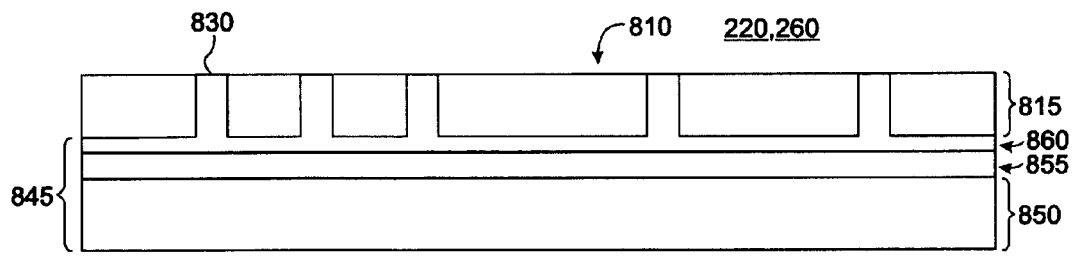
FIG. 8G is a flipped side view of either the first spacer layer or the second spacer layer bonded to the spacer carrier following filling the holes with a conductive material for the radial power combiner of FIG. 3.
Figure 8H:
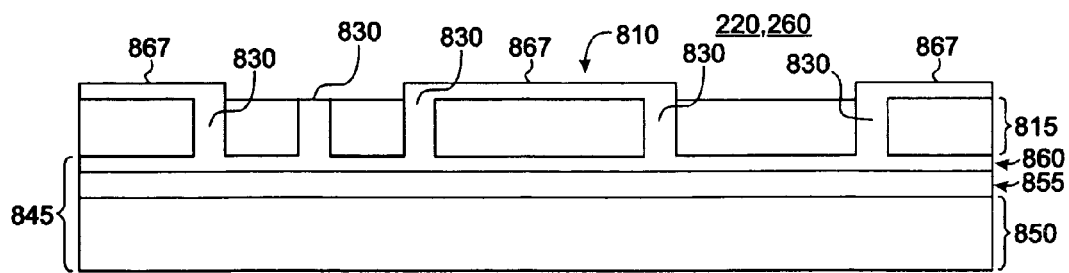
FIG. 8H is a flipped side view of either the first spacer layer or the second spacer layer bonded to the spacer carrier following patterning the conductive layer for the radial power combiner of FIG. 3.
Figure 8I:
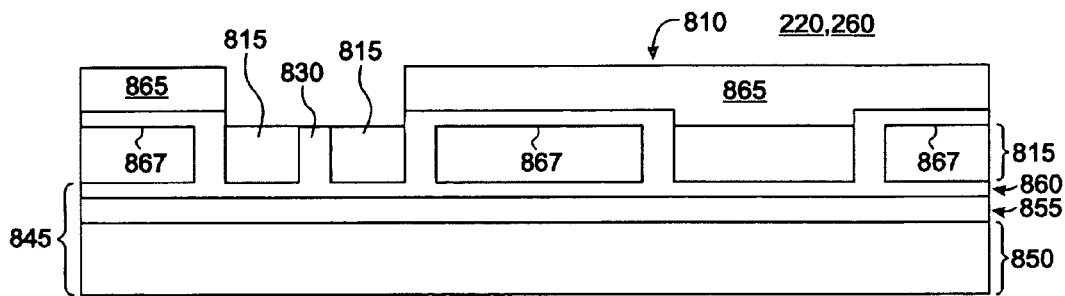
FIG. 8I is a flipped side view of either the first spacer layer or the second spacer layer bonded to the spacer carrier following a photoresist layer patterning for the radial power combiner of FIG. 3.
Figure 8J:
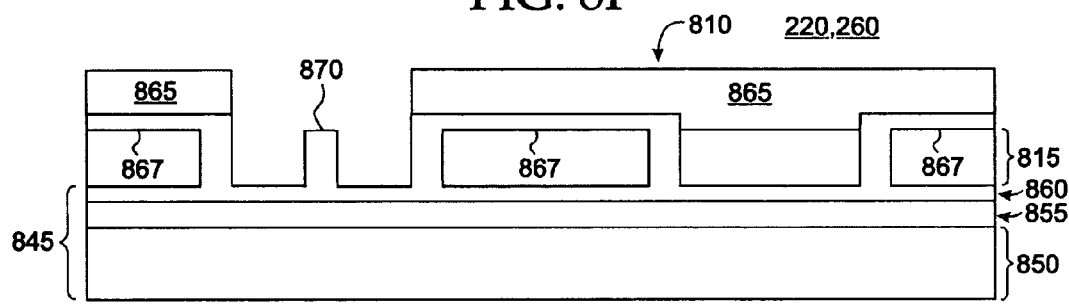
FIG. 8J is a flipped side view of either the first spacer layer or the second spacer layer bonded to the spacer carrier following removal of the spacer substrate surrounding selected plated holes for the radial power combiner of FIG. 3.
Figure 8K:
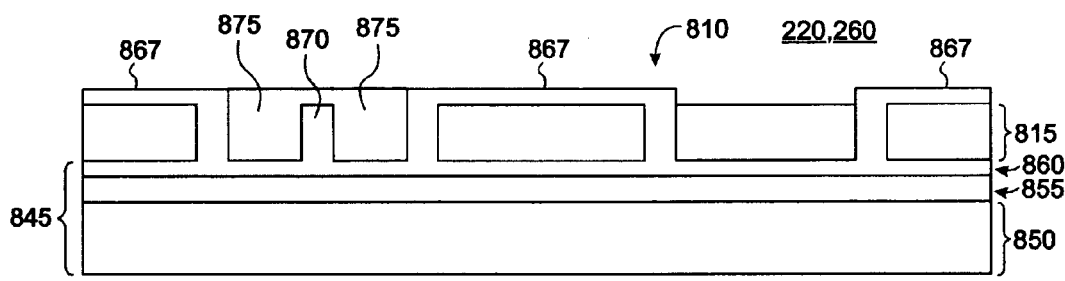
FIG. 8K is a flipped side view of either the first spacer layer or the second spacer layer bonded to the spacer carrier following backfilling the spacer substrate removed surrounding selected plated holes for the radial power combiner of FIG. 3.
Figure 8L:
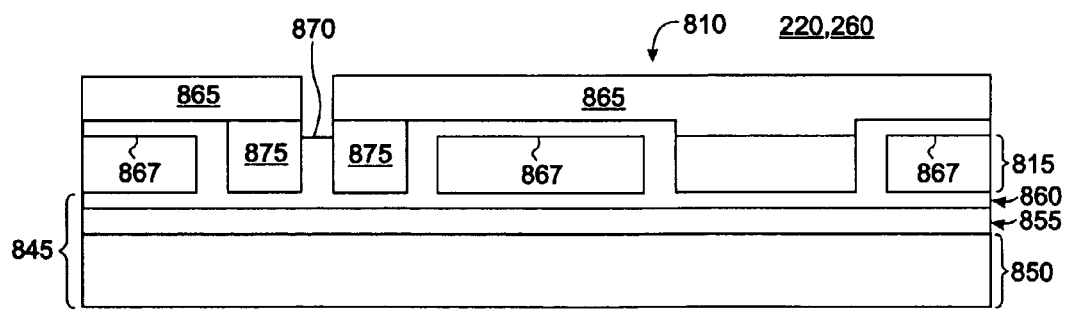
FIG. 8L is a flipped side view of either the first spacer layer or the second spacer layer bonded to the spacer carrier following an additional photoresist layer patterning for the radial power combiner of FIG. 3.
Figure 8M:
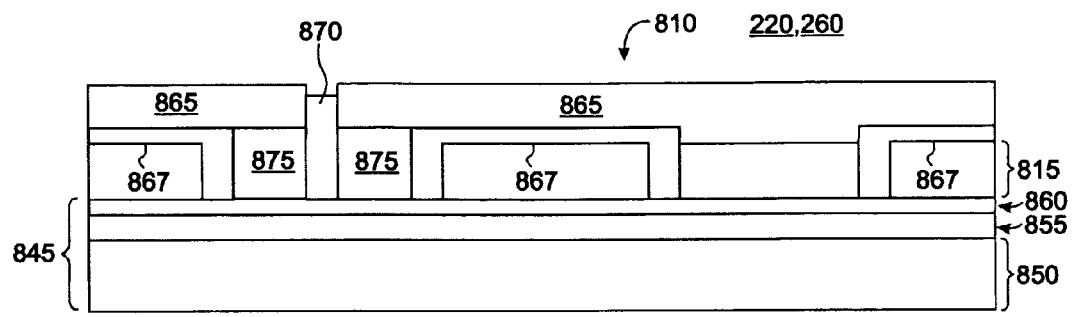
FIG. 8M is a flipped side view of either the first spacer layer or the second spacer layer bonded to the spacer carrier following an additional plating process for the radial power combiner of FIG. 3.
Figure 8N:
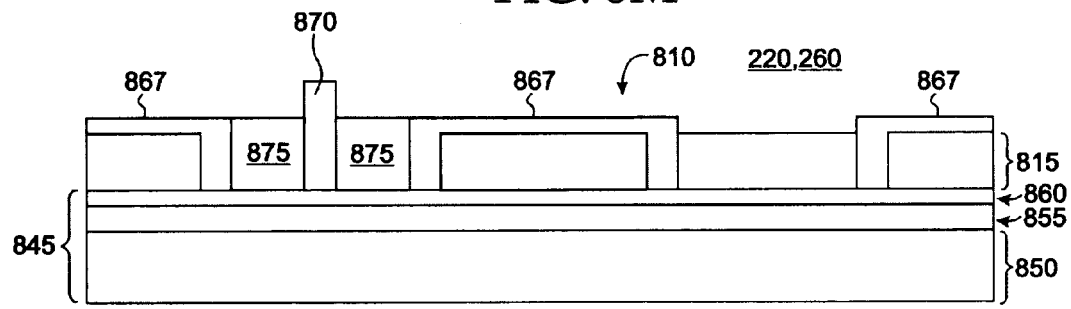
FIG. 8N is a flipped side view of either the first spacer layer or the second spacer layer bonded to the spacer carrier following a photoresist strip process for the radial power combiner of FIG. 3.
Figure 8O:
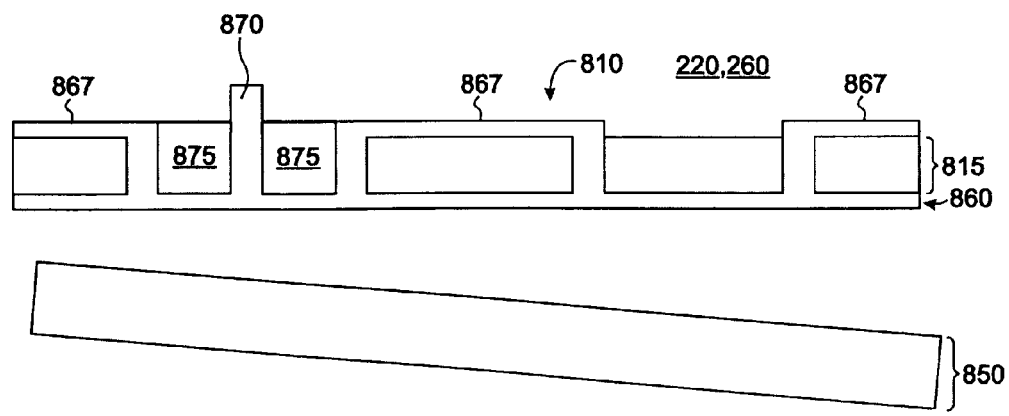
FIG. 8O is a flipped side view of either the first spacer layer or the second spacer layer following demounting the spacer carrier for the radial power combiner of FIG. 3
Figure 8P:
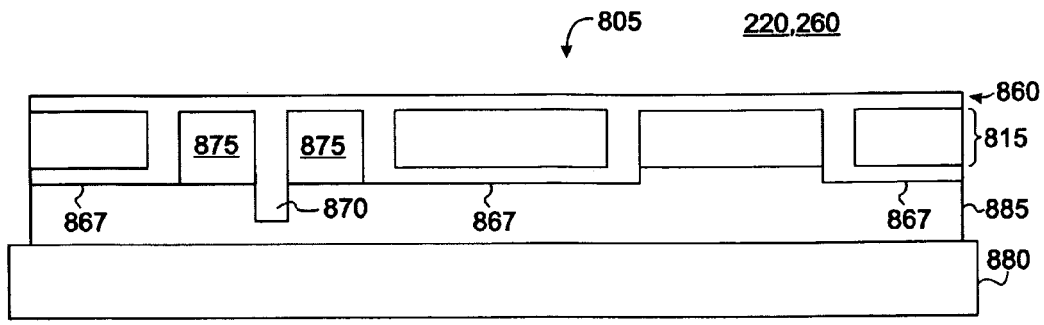
FIG. 8P is a side view of either the first spacer layer or the second spacer layer following bonding to an additional spacer carrier for the radial power combiner of FIG. 3.
Figure 8Q:
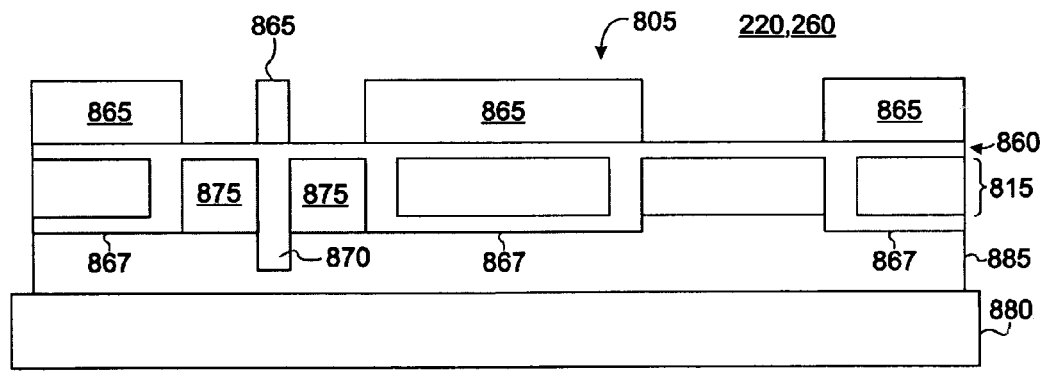
FIG. 8Q is a side view of either the first spacer layer or the second spacer layer following yet another photoresist layer patterning for the radial power combiner of FIG. 3.
Figure 8R:
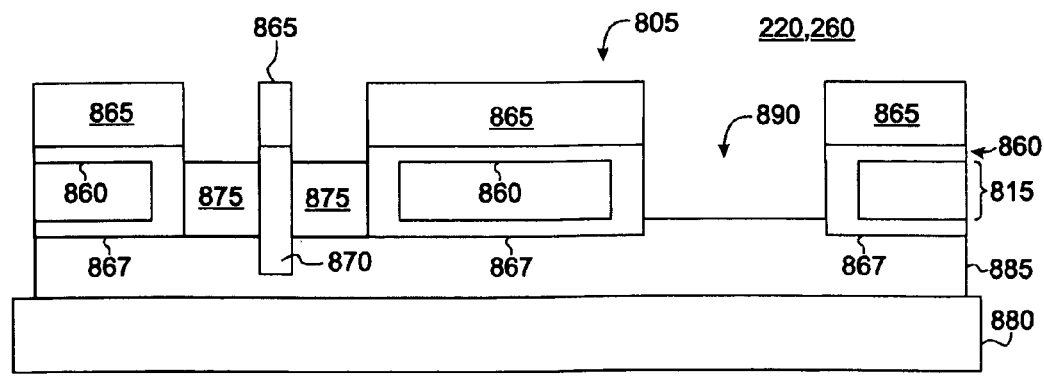
FIG. 8R is a side view of either the first spacer layer or the second spacer layer following etching the outer conductive layer and etching exposed spacer substrate to form a cavity in for the radial power combiner of FIG. 3.
Figure 8S:
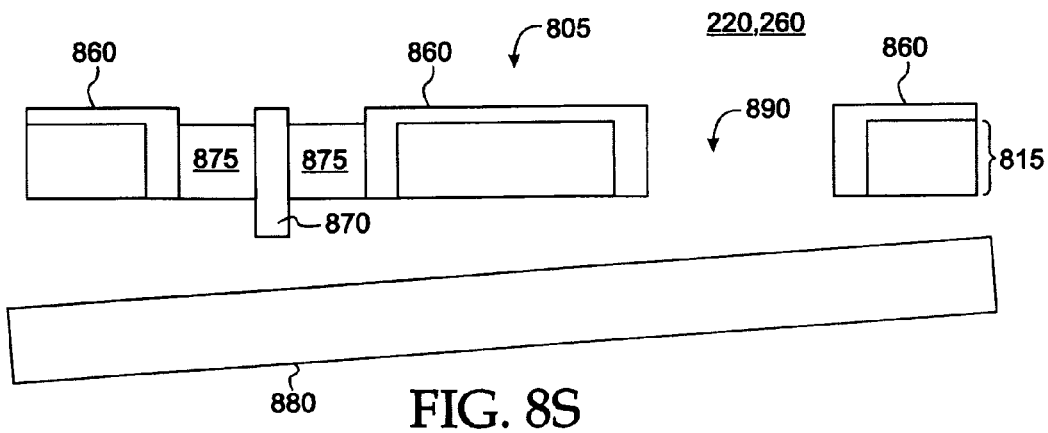
FIG. 8S is a side view of either the first spacer layer or the second spacer layer following photoresist strip with the demounted additional spacer carrier for the radial power combiner of FIG. 3.
Figure 8T:
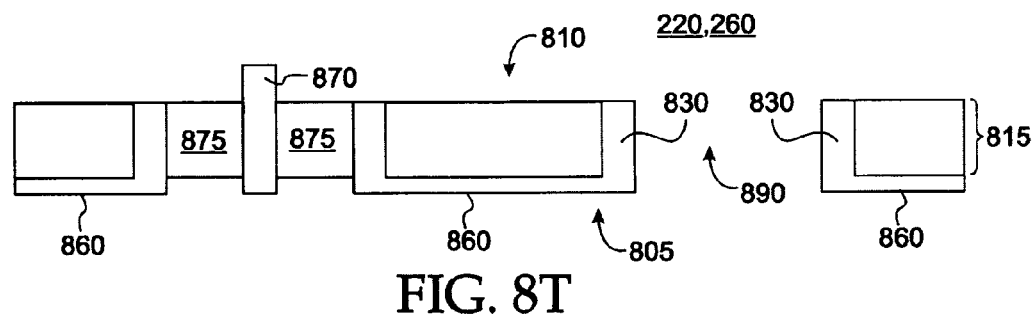
FIG. 8T is a side view of either the first spacer layer or the second spacer layer following photoresist strip and demounting the additional spacer carrier for the radial power combiner of FIG. 3.

FIGS. 8A-8T show the results following various processes on the first spacer layer 220 or on the second spacer layer 260 during processing for the radial power combiner 300 of FIG. 3. Processing for the first spacer layer 220 is similar to that of processing for the second spacer layer 270.

FIG. 8A is a side view of either the first spacer layer 220 or the second spacer layer 260 following the processing of patterning a barrier layer 820 on either the first spacer layer 220 or the second spacer layer 260 of a spacer substrate 815 for the radial power combiner 300 of FIG. 3. The barrier layer 820 could be nickel (Ni) or other appropriate material. The spacer substrate 815 has a spacer first side 805 on which the barrier layer 820 is patterned and a spacer second side 810 on the reverse side. The first spacer layer 220 and the second spacer layer 260 provide routing for signal lines and add rigidity to the radial power combiner 300 of FIG. 3.

The patterning barrier layer process could, for example, comprise the sub-processes of photoresist deposition, photoresist exposure through a photomask, photoresist cure, selective removal of part of the photoresist, Ni etch, and strip of the remaining photoresist. The patterning barrier layer process is performed on the spacer first side 805 of either the first spacer layer 220 or the second spacer layer 260. Following this processing, the first spacer layer 220 or the second spacer layer 260 comprises a spacer substrate 815 which could be InP or other appropriate material and a barrier layer 820 which could be Ni or other appropriate material having a barrier pattern 825.

FIG. 8B is a side view of either the first spacer layer 220 or the second spacer layer 260 following the process of spacer substrate 815 etching through openings in the barrier layer 820 on either the first spacer layer 220 or the second spacer layer 260 for the radial power combiner 300 of FIG. 3. The spacer substrate 815 etching process could, for example, comprise deep reactive ion etch (DRIE). The patterning barrier layer process is performed on the spacer first side 805 of either the first spacer layer 220 or the second spacer layer 260. This process creates the deep holes 830 which could be, for example, 50 microns deep in the spacer substrate 815.

FIG. 8C is a side view of either the first spacer layer 220 or the second spacer layer 260 following the processes of barrier layer strip and deposition of a bonding layer 840 on top of the spacer substrate 815 for the radial power combiner 300 of FIG. 3. The bonding layer 840 could be InP or other appropriate material.

FIG. 8D is a flipped side view of either the first spacer layer 220 or the second spacer layer 260 following the processes of barrier layer strip and deposition of a bonding layer 840 on top of the spacer substrate 815 for the radial power combiner 300 of FIG. 3. Also shown in FIG. 8D is a spacer carrier 845 comprising, for example, a spacer carrier substrate 850 which could be InP or other appropriate material having a sacrificial layer 855 which could be Ni or other appropriate material and another bonding (conductive) layer 860. The sacrificial layer 855 will be sacrificed when the first spacer layer 220 or the second spacer layer 260 is demounted from the spacer carrier substrate 850. For ease and clarity of illustration, only one hole 830 and one spacer carrier 845 are labeled in FIG. 8D.

FIG. 8E is a flipped side view of either the first spacer layer 220 or the second spacer layer 260 following bonding to the spacer carrier 845 for the radial power combiner 300 of FIG. 3. In FIG. 8E, the bonding layer 840 and the other bonding layer 860 have merged into one bonding layer 860. For ease and clarity of illustration, only one hole 830 is labeled in FIG. 8E.

FIG. 8F is a flipped side view of either the first spacer layer 220 or the second spacer layer 260 bonded to the spacer carrier 845 following a thinning of the spacer substrate 815 for the radial power combiner 300 of FIG. 3. Following the thinning process, the holes 830 are exposed. For ease and clarity of illustration, only one hole 830 is labeled in FIG. 8F.

FIG. 8G is a flipped side view of either the first spacer layer 220 or the second spacer layer 260 bonded to the spacer carrier 845 following filling the holes 830 with a conductive material for the radial power combiner 300 of FIG. 3. The conductive material filling the holes 830 could be gold or other appropriate material. Following the filling process, the holes 830 become plated holes 830. The gold of the conductive layer 867 provides conduction to all of the holes 830 to enable plating them. For ease and clarity of illustration, only one plated hole 830 is labeled in FIG. 8F.

FIG. 8H is a flipped side view of either the first spacer layer 220 or the second spacer layer 260 bonded to the spacer carrier 845 following patterning the conductive layer 867 for the radial power combiner 300 of FIG. 3. The conductive patterning material could be gold or other appropriate material. The conductive patterning material remaining after patterning is conductive pattern 865.

FIG. 8I is a flipped side view of either the first spacer layer 220 or the second spacer layer 260 bonded to the spacer carrier 845 following a photoresist layer patterning for the radial power combiner 300 of FIG. 3. Note that one of the plated holes 830 and that part of the spacer substrate 815 surrounding it are open through the patterned photoresist layer 865.

FIG. 8J is a flipped side view of either the first spacer layer 220 or the second spacer layer 260 bonded to the spacer carrier 845 following removal of the spacer substrate 815 surrounding selected plated holes 830 for the radial power combiner 300 of FIG. 3. The remaining freestanding plated hole 830 will now be referred to as probe 870.

FIG. 8K is a flipped side view of either the first spacer layer 220 or the second spacer layer 260 bonded to the spacer carrier 845 following backfilling the spacer substrate 815 removed surrounding selected plated holes 860 for the radial power combiner 300 of FIG. 3. The backplated material 875 is a low dielectric constant material such as benzocyclobutene (BCB) or other appropriate material. The BCB is used for planarization.

FIG. 8L is a flipped side view of either the first spacer layer 220 or the second spacer layer 260 bonded to the spacer carrier 845 following an additional photoresist layer patterning for the radial power combiner 300 of FIG. 3. Note that one of the probes 870 is open through the patterned photoresist layer 865.

FIG. 8M is a flipped side view of either the first spacer layer 220 or the second spacer layer 260 bonded to the spacer carrier 845 following an additional plating process for the radial power combiner 300 of FIG. 3. Note that one of the probes 870 has increased height due to this plating process.

FIG. 8N is a flipped side view of either the first spacer layer 220 or the second spacer layer 260 bonded to the spacer carrier 845 following a photoresist strip process for the radial power combiner 300 of FIG. 3.

FIG. 8O is a flipped side view of either the first spacer layer 220 or the second spacer layer 260 following demounting the spacer carrier 845 for the radial power combiner 300 of FIG. 3. In the demounting process, the sacrificial layer 855 is etched away.

FIG. 8P is a side view of either the first spacer layer 220 or the second spacer layer 260 following bonding to an additional spacer carrier 880 for the radial power combiner 300 of FIG. 3. The additional spacer carrier 880 could be sapphire or other appropriate material. The additional bonding layer 885 material could be futurrex (a product of Futurrex, Inc.) or other appropriate material.

FIG. 8Q is a side view of either the first spacer layer 220 or the second spacer layer 260 following yet another photoresist layer patterning for the radial power combiner 300 of FIG. 3.

FIG. 8R is a side view of either the first spacer layer 220 or the second spacer layer 260 following etching the outer conductive layer and etching exposed spacer substrate 815 to form a cavity 890 in for the radial power combiner 300 of FIG. 3.

FIG. 8S is a side view of either the first spacer layer 220 or the second spacer layer 260 following photoresist strip with the demounted additional spacer carrier 880 for the radial power combiner 300 of FIG. 3.

FIG. 8T is a side view of either the first spacer layer 220 or the second spacer layer 260 following photoresist strip and demounting the additional spacer carrier 880 for the radial power combiner 300 of FIG. 3.

FIGS. 9A-9I show the results following various processes on the first waveguide structure layer 230 or on the second waveguide structure layer 250 during processing for the radial power combiner 300 of FIG. 3. Processing for the first waveguide structure layer 230 is similar to that of processing for the second waveguide structure layer 250.

Figure 9A:
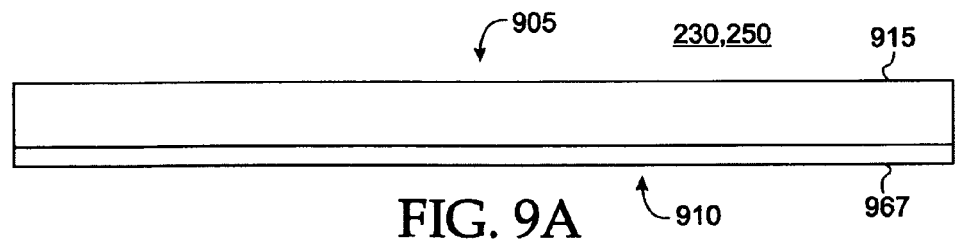
FIG. 9A is a side view of either the first waveguide structure layer or the second waveguide structure layer following depositing a conductive layer on either the first waveguide structure layer or the second waveguide structure layer of a waveguide structure substrate for the radial power combiner of FIG. 3.

FIG. 9A is a side view of either the first waveguide structure layer 230 or the second waveguide structure layer 250 following depositing a conductive layer 967 on either the first waveguide structure layer 230 or the second waveguide structure layer 250 of a waveguide structure substrate 915 for the radial power combiner 300 of FIG. 3. The conductive layer 967 could be gold (Au) or other appropriate material. The waveguide structure substrate 915 could be silicon (Si) or other appropriate material. The waveguide structure substrate 915 has a waveguide structure first side 905 and a waveguide structure second side 910.

Figure 9B:
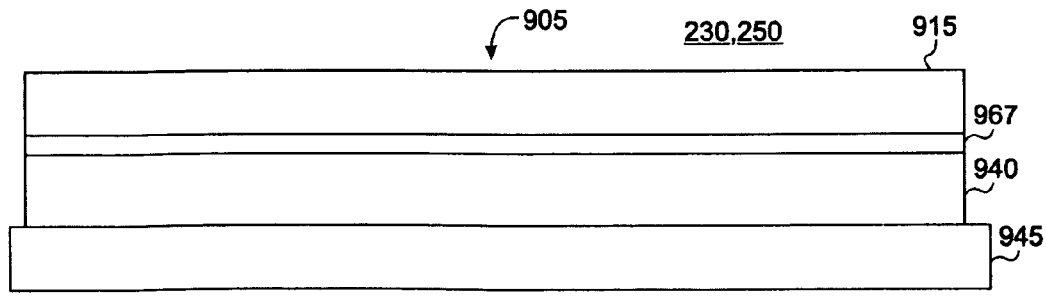
FIG. 9B is a side view of either the first waveguide structure layer or the second waveguide structure layer following bonding the waveguide structure substrate to a waveguide structure carrier for the radial power combiner of FIG. 3.

FIG. 9B is a side view of either the first waveguide structure layer 230 or the second waveguide structure layer 250 following bonding the waveguide structure substrate 915 to a waveguide structure carrier 945 for the radial power combiner 300 of FIG. 3. In FIG. 9B, the bonding material of the bonding layer 940 could be a thermal plastic or other appropriate material.

Figure 9C:
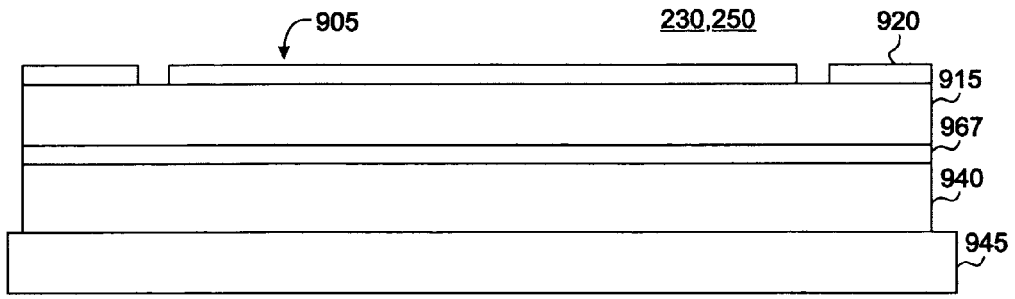
FIG. 9C is a side view of either the first waveguide structure layer or the second waveguide structure layer following the process of patterning a barrier layer on either the first waveguide structure layer or the second waveguide structure layer of a waveguide structure substrate for the radial power combiner of FIG. 3.

FIG. 9C is a side view of either the first waveguide structure layer 230 or the second waveguide structure layer 250 following the process of patterning a barrier layer 920 on either the first waveguide structure layer 230 or the second waveguide structure layer 250 of a waveguide structure substrate 915 for the radial power combiner 300 of FIG. 3. The barrier layer 920 could be nickel (Ni) or other appropriate material. The waveguide structure substrate 915 has a waveguide structure first side 905 on which the barrier layer 920 is patterned and a waveguide structure second side 910 on the reverse side.

The patterning barrier layer process could, for example, comprise the sub-processes of photoresist deposition, photoresist exposure through a photomask, photoresist cure, selective removal of part of the photoresist, Ni etch, and strip of the remaining photoresist. The patterning barrier layer process is performed on the waveguide structure first side 905 of either the first waveguide structure layer 230 or the second waveguide structure layer 250.

Figure 9D:
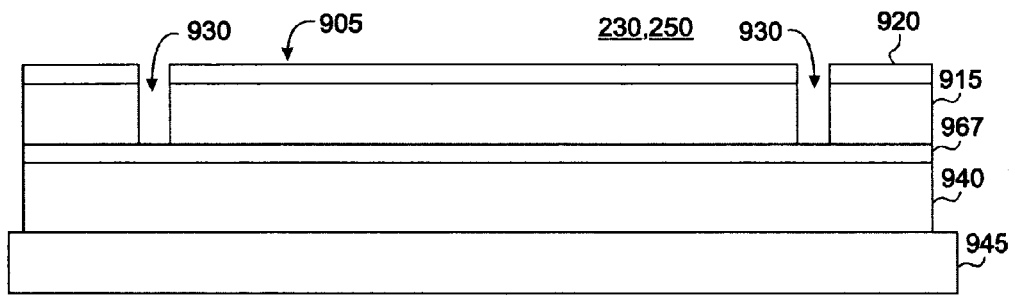
FIG. 9D is a side view of either the first waveguide structure layer or the second waveguide structure layer following the process of etching the waveguide structure substrate etching through openings in the barrier layer on either the first waveguide structure layer or the second waveguide structure layer for the radial power combiner of FIG. 3.

FIG. 9D is a side view of either the first waveguide structure layer 230 or the second waveguide structure layer 250 following the process of etching the waveguide structure substrate 915 etching through openings in the barrier layer 920 on either the first waveguide structure layer 230 or the second waveguide structure layer 250 for the radial power combiner 300 of FIG. 3. The waveguide structure substrate 915 etching process could, for example, comprise deep reactive ion etch (DRIE). The patterning barrier layer process is performed on the waveguide structure first side 905 of either the first waveguide structure layer 230 or the second waveguide structure layer 250. This process creates the deep holes 930 which could be, for example, on the order of 150 microns deep in the waveguide structure substrate 915.

Figure 9E:
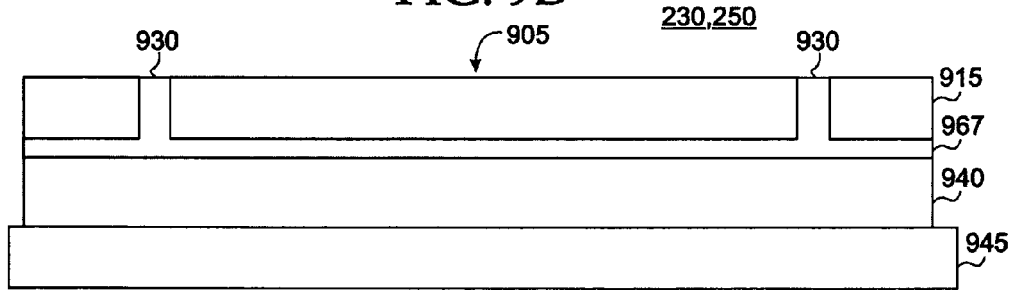
FIG. 9E is a side view of either the first waveguide structure layer or the second waveguide structure layer bonded to the waveguide structure carrier following plating the holes with a conductive material and stripping the barrier layer for the radial power combiner of FIG. 3.

FIG. 9E is a side view of either the first waveguide structure layer 230 or the second waveguide structure layer 250 bonded to the waveguide structure carrier 945 following plating the holes 930 with a conductive material and stripping the barrier layer 920 for the radial power combiner 300 of FIG. 3. The conductive material filling the holes 930 could be gold or other appropriate material. Following the filling process, the holes 930 become plated holes 930. The gold of the conductive layer 967 provides conduction to all of the holes 930 to enable plating them.

Figure 9F:
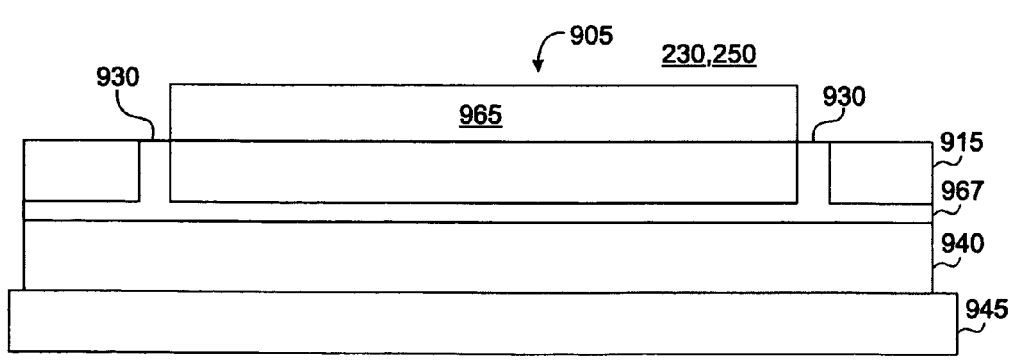
FIG. 9F is a side view of either the first waveguide structure layer or the second waveguide structure layer bonded to the waveguide structure carrier following a photoresist layer patterning for the radial power combiner of FIG. 3.

FIG. 9F is a side view of either the first waveguide structure layer 230 or the second waveguide structure layer 250 bonded to the waveguide structure carrier 945 following a photoresist layer patterning for the radial power combiner 300 of FIG. 3. Note that two of the plated holes 930 and that part of the waveguide structure substrate 915 next to it are open through the patterned photoresist layer 965.

Figure 9G:
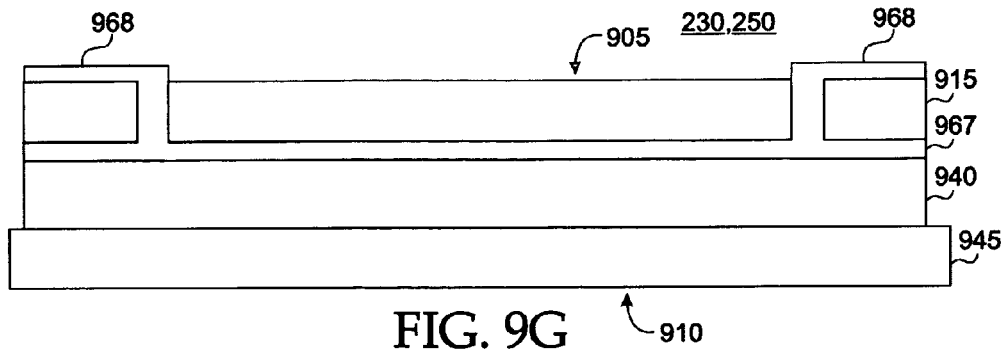
FIG. 9G is a side view of either the first waveguide structure layer or the second waveguide structure layer following depositing a bonding conductive layer on and stripping photoresist from either the first waveguide structure layer or the second waveguide structure layer of a waveguide structure substrate for the radial power combiner of FIG. 3.

FIG. 9G is a side view of either the first waveguide structure layer 230 or the second waveguide structure layer 250 following depositing a bonding conductive layer 968 on and stripping photoresist from either the first waveguide structure layer 230 or the second waveguide structure layer 250 of a waveguide structure substrate 915 for the radial power combiner 300 of FIG. 3. The bonding conductive layer 968 could be gold (Au) or other appropriate material.

Figure 9H:
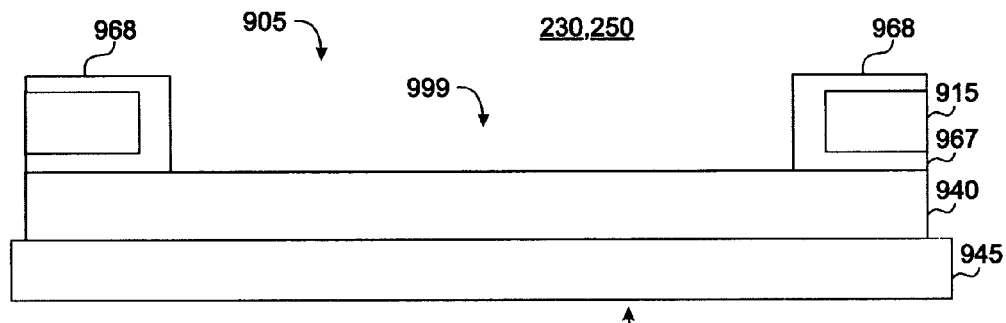
FIG. 9H is a side view of either the first waveguide structure layer or the second waveguide structure layer following etching the exposed waveguide structure substrate for the radial power combiner of FIG. 3.

FIG. 9H is a side view of either the first waveguide structure layer 230 or the second waveguide structure layer 250 following etching the exposed waveguide structure substrate 915 for the radial power combiner 300 of FIG. 3. A waveguide structure cavity 999 is created in either the first waveguide structure layer 230 or the second waveguide structure layer 250 following this etching.

Figure 9I:
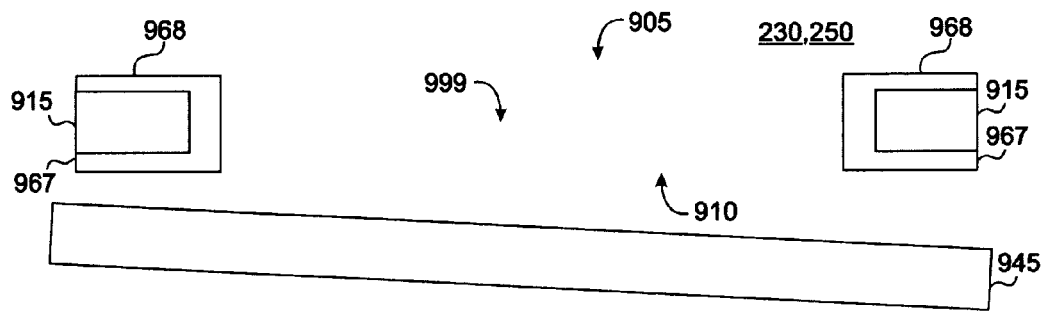
FIG. 9I is a side view of either the first waveguide structure layer or the second waveguide structure layer following demounting the waveguide structure carrier for the radial power combiner of FIG. 3.

FIG. 9I is a side view of either the first waveguide structure layer 230 or the second waveguide structure layer 250 following demounting the waveguide structure carrier 945 for the radial power combiner 300 of FIG. 3. In the demounting process, the bonding layer 940 is etched away.

FIGS. 10A-10L show the results following various processes on the circuit layer 240 during processing for the radial power combiner 300 of FIG. 3.

Figure 10A:
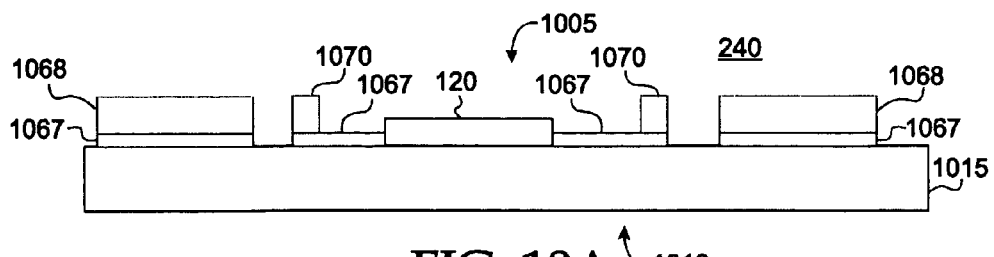
FIG. 10A is a side view of the circuit layer following process steps that have created the electronic amplifier circuits, depositing a front side conductive layer, and creating the probes in a probe conductive layer on a circuit substrate for the radial power combiner of FIG. 3.

FIG. 10A is a side view of the circuit layer 240 following process steps that have created the electronic amplifier circuits 120, depositing a front side conductive layer 1067, and creating the probes 1070 in a probe conductive layer 1068 on a circuit substrate 1015 for the radial power combiner 300 of FIG. 3. The front side conductive layer 1067 could be gold (Au) or other appropriate material. The circuit substrate 1015 could be InP or other appropriate material. The circuit substrate 1015 has a circuit first side 1005 and a circuit second side 1010. Only one of the electronic amplifier circuits 120 on the circuit substrate 1015 wafer is shown in FIG. 10A. While the electronic amplifier circuit 120 is shown as block in FIG. 10A it is actually fabricated monolithically in the circuit substrate 1015.

FIG. 10B is a side view of the circuit layer 240 following process steps that patterned and etched the back side conductive layer 1069 on the circuit second side 1010 of the circuit substrate 1015 for the radial power combiner 300 of FIG. 3. The back side conductive layer 1069 could be gold (Au) or other appropriate material.

FIG. 10C is a side view of the circuit layer 240 following bonding the circuit substrate 1015 to a circuit carrier 1045 for the radial power combiner 300 of FIG. 3. In FIG. 10C, the bonding material of the bonding layer 1040 could be futurrex or other appropriate material.

FIG. 10D is a side view of the circuit layer 240 following a photoresist layer patterning for the radial power combiner 300 of FIG. 3. Note that two of the plated holes 1030 are open through the patterned photoresist layer 1065.

FIG. 10E is a side view of the circuit layer 240 following an additional plating process, a photoresist strip process, and demounting the circuit carrier 1045 for the radial power combiner 300 of FIG. 3. Note that the probes 870 have increased height due to this plating process.

Figure 10F:
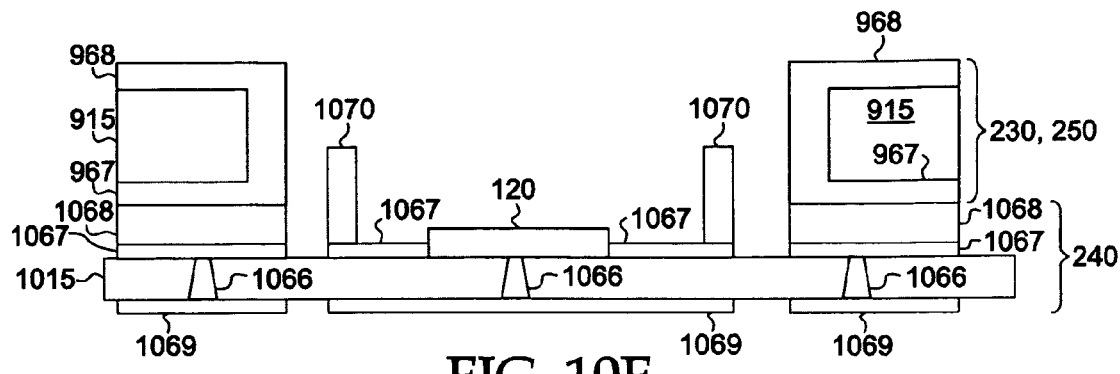
FIG. 10F is a side view of the circuit layer bonded to either the first waveguide structure layer or to the second waveguide structure layer for the radial power combiner of FIG. 3.

FIG. 10F is a side view of the circuit layer 240 bonded to either the first waveguide structure layer 230 or to the second waveguide structure layer 250 for the radial power combiner 300 of FIG. 3.

Figure 10G:
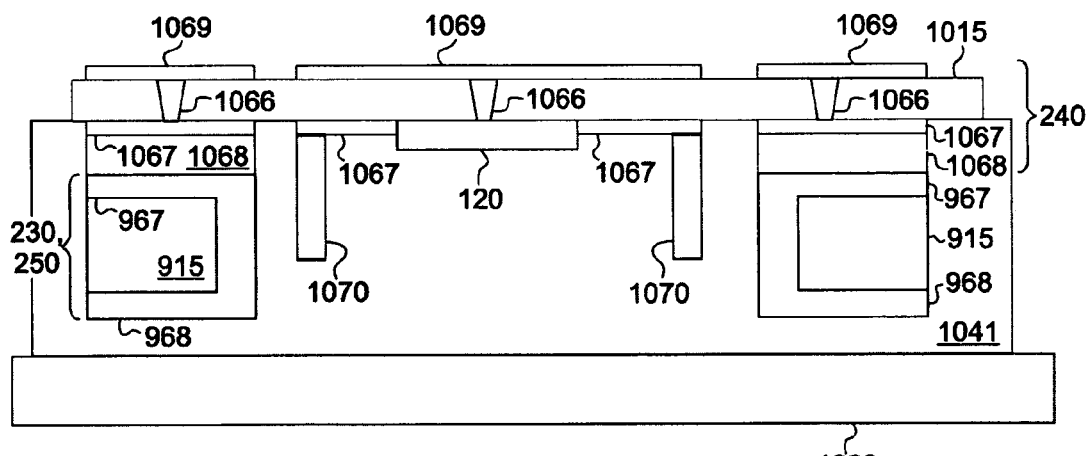
FIG. 10G is a side view of the circuit layer bonded to either the first waveguide structure layer or to the second waveguide structure layer with either the first waveguide structure layer or the second waveguide structure layer bonded to another carrier for the radial power combiner of FIG. 3.

FIG. 10G is a side view of the circuit layer 240 bonded to either the first waveguide structure layer 230 or to the second waveguide structure layer 250 with either the first waveguide structure layer 230 or the second waveguide structure layer 250 bonded to another carrier 1080 for the radial power combiner 300 of FIG. 3. Either the first waveguide structure layer 230 or the second waveguide structure layer 250 is bonded to another carrier 1080 via another bonding layer 1041. The first waveguide structure layer 230 or the second waveguide structure layer 250 could be bonded to the other carrier 1080 using Futurrex, tape mount, or other appropriate material.

Figure 10H:
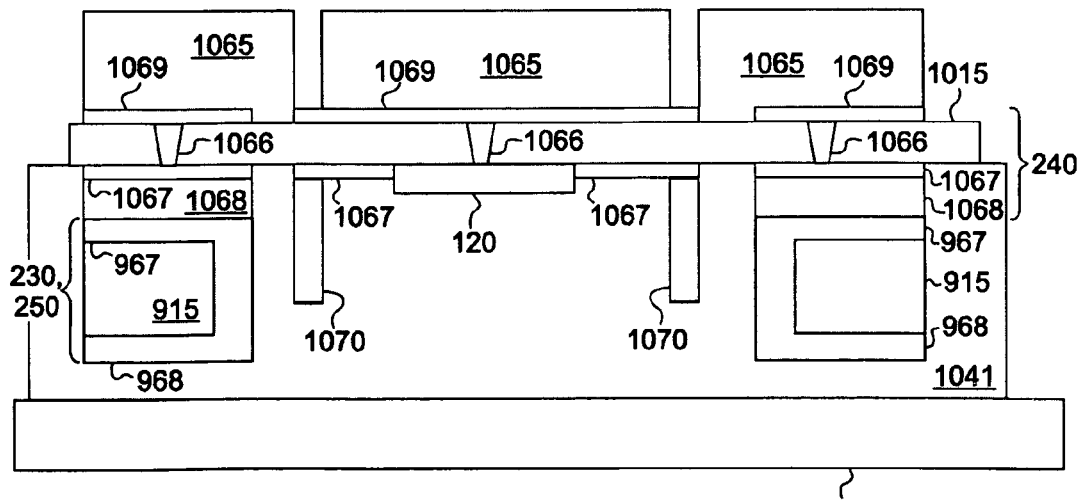
FIG. 10H is a side view of the circuit layer bonded to either the first waveguide structure layer or to the second waveguide structure layer with either the first waveguide structure layer or the second waveguide structure layer bonded to another carrier following a photoresist layer patterning for the radial power combiner of FIG. 3.

FIG. 10H is a side view of the circuit layer 240 bonded to either the first waveguide structure layer 230 or to the second waveguide structure layer 250 with either the first waveguide structure layer 230 or the second waveguide structure layer 250 bonded to another carrier 1080 following a photoresist layer patterning for the radial power combiner 300 of FIG. 3. Note that in two areas of FIG. 10H the back side conductive layer 1069 is open through the patterned photoresist layer 1065.

Figure 10I:
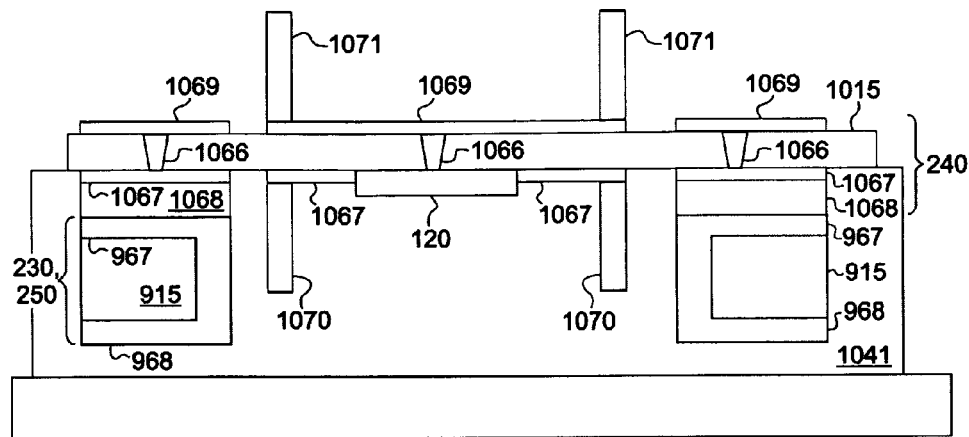
FIG. 10I is a side view of the circuit layer bonded to either the first waveguide structure layer or to the second waveguide structure layer with either the first waveguide structure layer or the second waveguide structure layer bonded to another carrier following another plating process and a photoresist strip process for the radial power combiner of FIG. 3.

FIG. 10I is a side view of the circuit layer 240 bonded to either the first waveguide structure layer 230 or to the second waveguide structure layer 250 with either the first waveguide structure layer 230 or the second waveguide structure layer 250 bonded to another carrier 1080 following another plating process and a photoresist strip process for the radial power combiner 300 of FIG. 3. These process steps create the backside probes 1071.

Figure 10J:
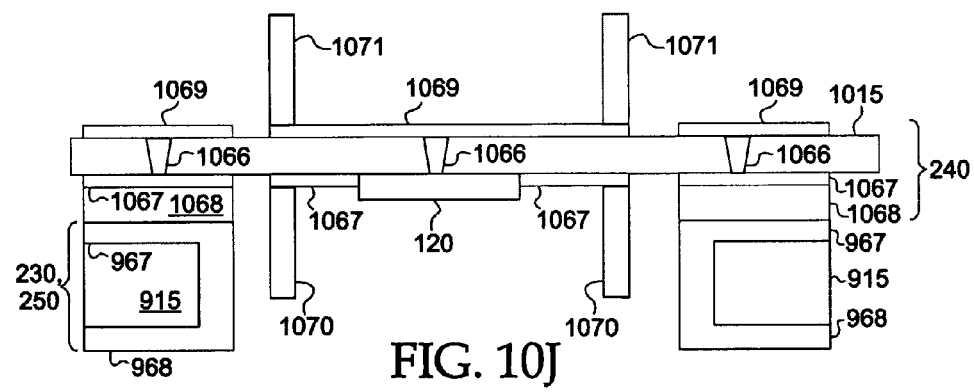
FIG. 10J is a side view of the circuit layer bonded to either the first waveguide structure layer or to the second waveguide structure layer following the demounting of the other circuit carrier from either the first waveguide structure layer or to the second waveguide structure layer for the radial power combiner of FIG. 3.

FIG. 10J is a side view of the circuit layer 240 bonded to either the first waveguide structure layer 230 or to the second waveguide structure layer 250 following the demounting of the other circuit carrier 1080 from either the first waveguide structure layer 230 or to the second waveguide structure layer 250 for the radial power combiner 300 of FIG. 3.

Figure 10K:
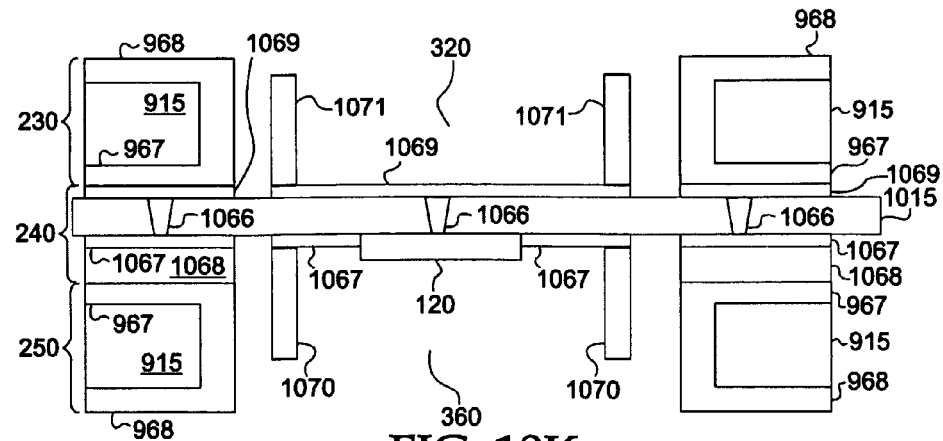
FIG. 10K is a side view of the circuit layer bonded to both the first waveguide structure layer and to the second waveguide structure layer for the radial power combiner of FIG. 3.

FIG. 10K is a side view of the circuit layer 240 bonded to both the first waveguide structure layer 230 and to the second waveguide structure layer 250 for the radial power combiner 300 of FIG. 3. Also shown in FIG. 10K are the first waveguide cavity 320 and the second waveguide cavity 360.

Figure 11:
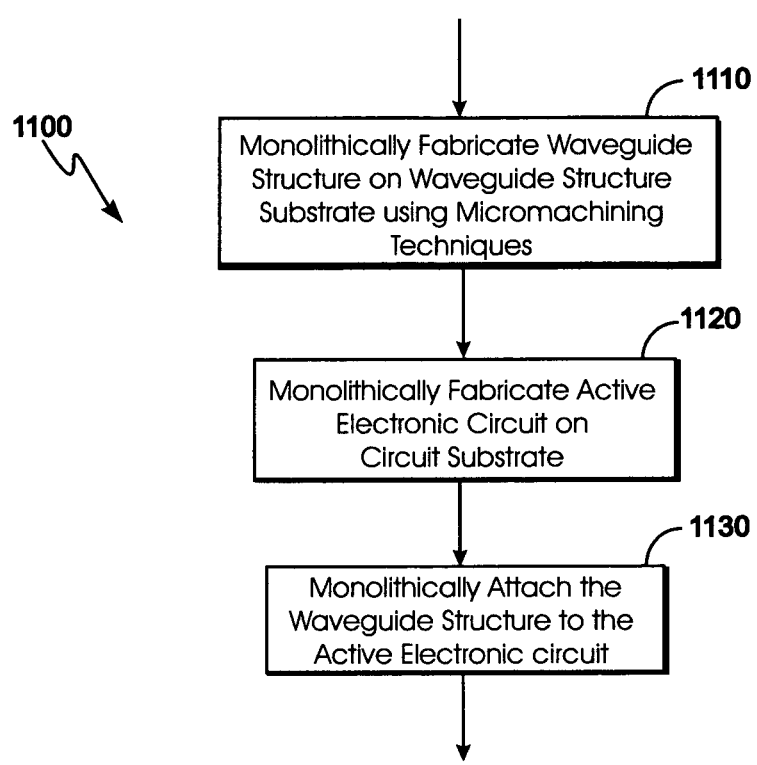
FIG. 11 is a flowchart of a method for fabricating an electronic system.

FIG. 11 is a flowchart of a method 1100 for fabricating an electronic system 100. In block 1110 of FIG. 11, a waveguide structure 110 is monolithically fabricated using micromachining techniques. Block 1110 then transfers control to block 1120.

In block 1120 an active electronic circuit 120 is fabricated monolithically. Block 1120 then transfers control to block 1130.

In block 1130 the waveguide structure 110 is monolithically attached to the active electronic circuit 120 to create a system 100. The system 100 is capable of receiving an input signal 130 and transmitting an output signal 140 wherein the input signal 130 and the output signal 140 have frequencies 610 in the terahertz frequency range. The system 100 is fabricated as a monolithic integrated structure and can be fabricated in a batch monolithic integrated process. Block 1130 then terminates the method.

Figure 12:
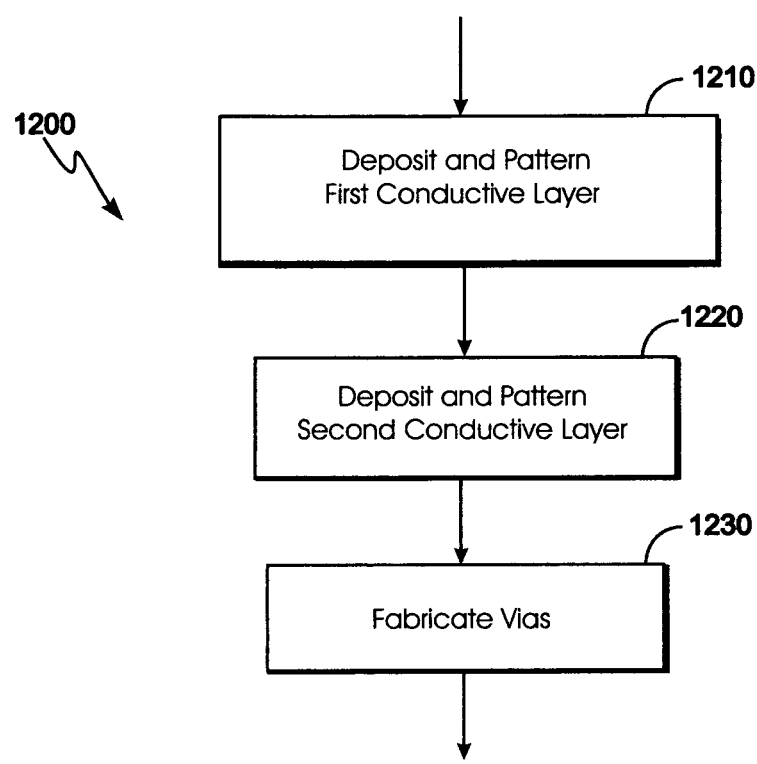
FIG. 12 is a method for fabricating either an input layer or an output layer for the radial power combiner of FIG. 3.

FIG. 12 is a method 1200 for fabricating either an input layer 210 or an output layer 270 for the radial power combiner 300 of FIG. 3. In block 1210 of FIG. 12, a first conductive layer 720 is deposited and patterned on a first side 705 of either the input layer 210 or the output layer 270. Block 1210 then transfers control to block 1220.

In block 1220 a second conductive layer 730 is deposited and patterned on the first side 705 of either the input layer 210 or the output layer 270. Block 1220 then transfers control to block 1230.

In block 1230, vias 745 are fabricated in the first substrate 715. Block 1230 then terminates the method.

Figure 13:
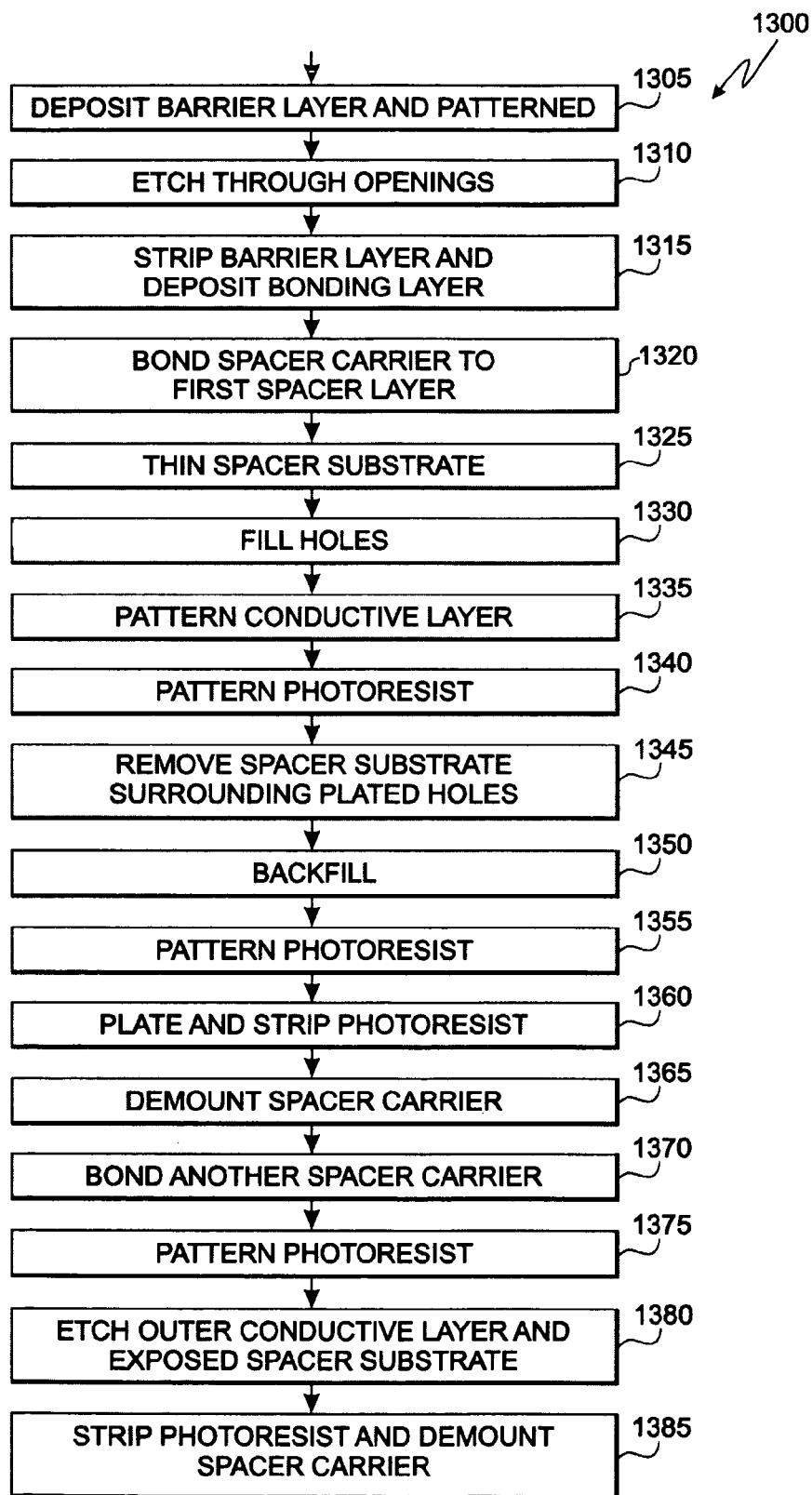
FIG. 13 is a method for processing either the first spacer layer or the second spacer layer.

FIG. 13 is a method 1300 for processing either the first spacer layer 220 or the second spacer layer 260. In block 1305 a barrier layer 820 is deposited and patterned on either the first spacer layer 220 or the second spacer layer 260 of a spacer substrate 815 for the radial power combiner 300 of FIG. 3. Block 1305 then transfers control to block 1310.

In block 1310, through openings are etched through the barrier layer 820 into the spacer substrate 815 of either the first spacer layer 220 or the second spacer layer 260. The spacer substrate 815 etching process could, for example, comprise deep reactive ion etch (DRIE). Block 1310 then transfers control to block 1315.

In block 1315, the barrier layer is stripped and a bonding layer 840 is deposited on top of the spacer substrate 815. Block 1315 then transfers control to block 1320.

In block 1320, a spacer carrier 845 is bonded to either the first spacer layer 220 or the second spacer layer 260. Block 1320 then transfers control to block 1325.

In block 1325, spacer substrate 815 is thinned. Block 1325 then transfers control to block 1330.

In block 1330, the holes 830 are filled with a conductive material. Block 1330 then transfers control to block 1335.

In block 1335, the conductive layer 867 is patterned. Block 1335 then transfers control to block 1340.

In block 1340, a photoresist layer is patterned. Note that one of the plated holes 830 and that part of the spacer substrate 815 surrounding it are open through the patterned photoresist layer 865. Block 1340 then transfers control to block 1345.

In block 1345, spacer substrate 815 surrounding selected plated holes 830 is removed. Block 1345 then transfers control to block 1350.

In block 1350, the spacer substrate 815 removed surrounding selected plated holes 860 is backfilled. Block 1350 then transfers control to block 1355.

In block 1355, an additional photoresist layer is patterned. Note that one of the probes 870 is open through the patterned photoresist layer 865. Block 1355 then transfers control to block 1360.

In block 1360, the photoresist is stripped. Block 1360 then transfers control to block 1365.

In block 1365, the spacer carrier 845 is demounted from the first spacer layer 220 or the second spacer layer 260. Block 1365 then transfers control to block 1370.

In block 1370, an additional spacer carrier 880 is bonded to either the first spacer layer 220 or the second spacer layer 260. The additional spacer carrier 880 could be sapphire or other appropriate material. The additional bonding layer 885 material could be futurrex (a product of Futurrex, Inc.) or other appropriate material. Block 1370 then transfers control to block 1375.

In block 1375, yet another photoresist layer is patterned. Block 1375 then transfers control to block 1380.

In block 1380, the outer conductive layer and the exposed spacer substrate 815 are etched. Block 1380 then transfers control to block 1385.

In block 1385, the photoresist is stripped and the additional spacer carrier 880 is demounted. Block 1385 then transfers control to block 1390. Block 1390 then terminates the method.

Figure 14:
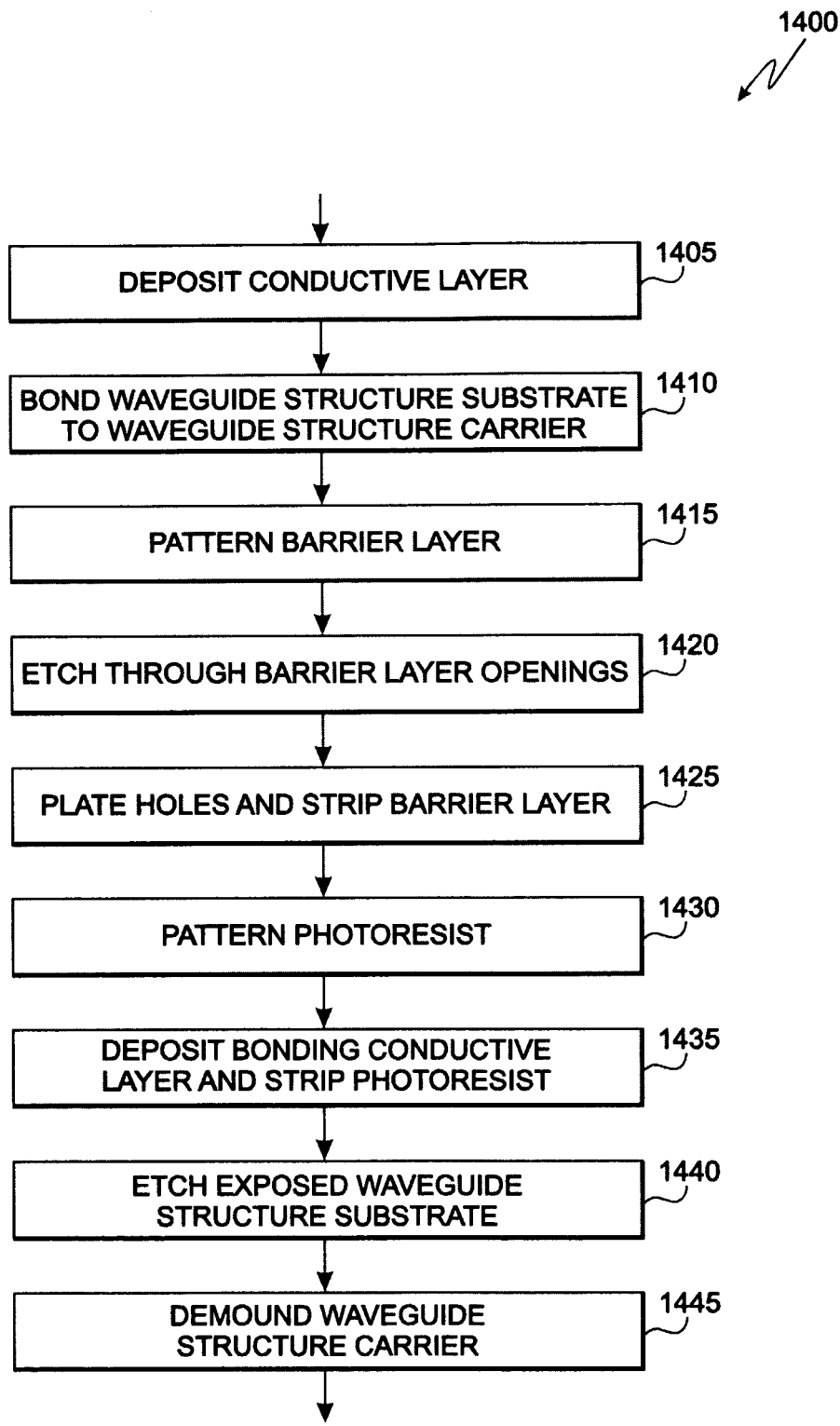
FIG. 14 is a method for processing either the first waveguide structure layer or on the second waveguide structure layer.

FIG. 14 is a method 1400 for processing either the first waveguide structure layer 230 or on the second waveguide structure layer 250. In block 1405, a conductive layer 967 is deposited on a waveguide structure substrate 915 of either the first waveguide structure layer 230 or the second waveguide structure layer 250. Block 1405 then transfers control to block 1410.

In block 1410, the waveguide structure substrate 915 is bonded to a waveguide structure carrier 945. Block 1410 then transfers control to block 1415.

In block 1415, a barrier layer 920 on a waveguide structure substrate 915 is patterned. The barrier layer 920 could be nickel (Ni) or other appropriate material. Block 1415 then transfers control to block 1420.

In block 1420, openings are etched through the barrier layer 920 pattern. The waveguide structure substrate 915 etching process could, for example, comprise deep reactive ion etch (DRIE). Block 1420 then transfers control to block 1425.

In block 1425, the holes 930 are plated with a conductive material and the barrier layer 920 is stripped. Block 1425 then transfers control to block 1430.

In block 1430, a photoresist is patterned. Some plated holes 930 and that part of the waveguide structure substrate 915 next to them are open through the patterned photoresist layer 965. Block 1430 then transfers control to block 1435.

In block 1435, a bonding conductive layer 968 is deposited on and photoresist is stripped from either the first waveguide structure layer 230 or the second waveguide structure layer 250 of a waveguide structure substrate 915. Block 1435 then transfers control to block 1440.

In block 1440, the exposed waveguide structure substrate 915 is etched. Block 1440 then transfers control to block 1445.

In block 1445, the waveguide structure carrier 945 is demounted. Block 1445 then terminates the method.

Figure 15:
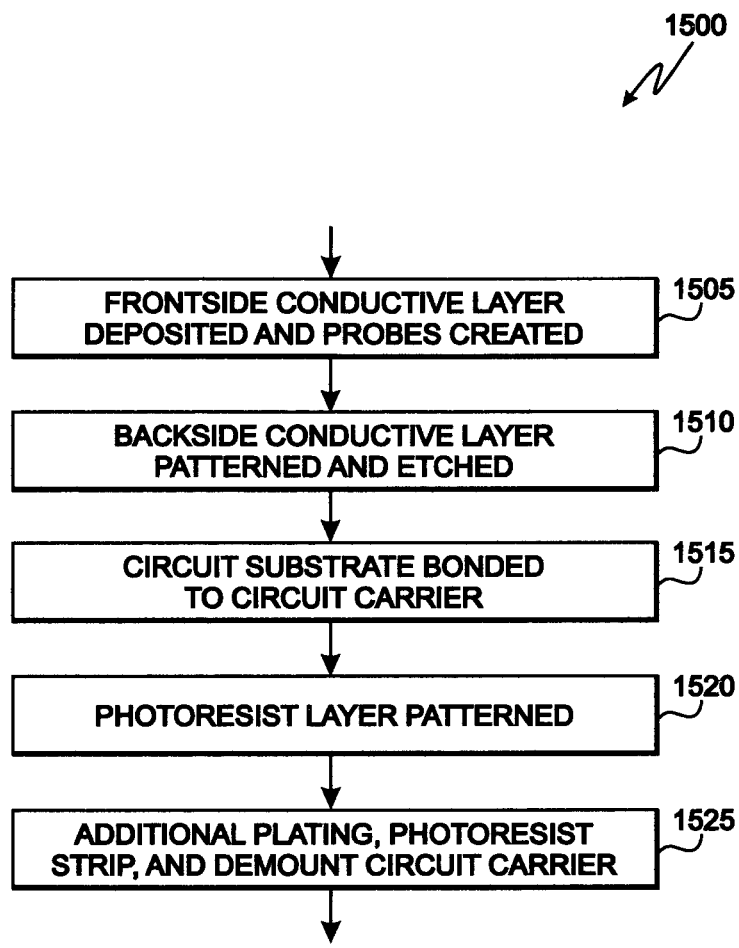
FIG. 15 is a method for processing the circuit layer for the radial power combiner of FIG. 3.

FIG. 15 is a method 1500 for processing the circuit layer 240 for the radial power combiner 300 of FIG. 3. In block 1505, a front side conductive layer 1067 is deposited and the probes 1070 are created in a probe conductive layer 1068 on a circuit substrate 1015 While the electronic amplifier circuit 120 is shown as block in FIG. 10A it is actually fabricated monolithically in the circuit substrate 1015. Block 1505 then transfers control to block 1510.

In block 1510, the back side conductive layer 1069 on the circuit second side 1010 of the circuit substrate 1015 is patterned and etched. Block 1510 then transfers control to block 1515.

In block 1515, the circuit substrate 1015 is bonded to a circuit carrier 1045. Block 1515 then transfers control to block 1520.

In block 1520, a photoresist layer is patterned. Block 1520 then transfers control to block 1525.

In block 1525, an additional plating process, a photoresist strip process, and demounting the circuit carrier 1045 are performed. Block 1525 then terminates the method.

Figure 16:
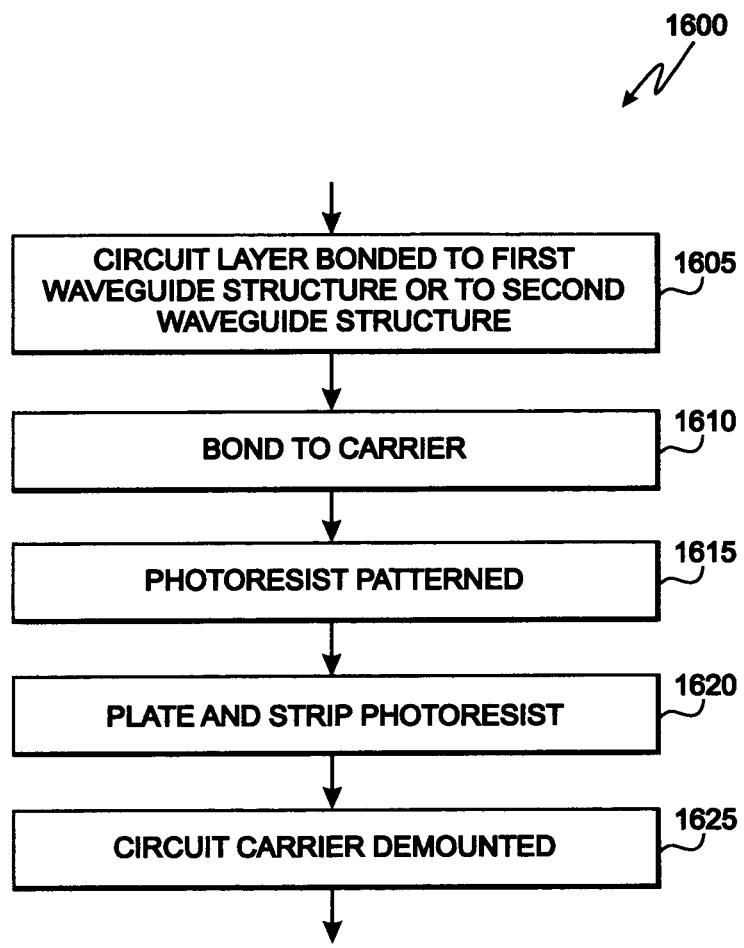
FIG. 16 is a method for bonding the various layers together for the radial power combiner of FIG. 3.

FIG. 16 is a method 1600 for bonding the various layers together for the radial power combiner 300 of FIG. 3. In block 1605, the circuit layer 240 is bonded to either the first waveguide structure layer 230 or to the second waveguide structure layer 250. Block 1605 then transfers control to block 1610.

In block 1610, either the first waveguide structure layer 230 or the second waveguide structure layer 250 is bonded to another carrier 1080 via another bonding layer 1041. The first waveguide structure layer 230 or the second waveguide structure layer 250 could be bonded to the other carrier 1080 using Futurrex, tape mount, or other appropriate material. Block 1610 then transfers control to block 1615.

In block 1615, a photoresist layer is patterned. Block 1615 then transfers control to block 1620.

In block 1620, another plating process and a photoresist strip process are performed. Block 1620 then transfers control to block 1625.

In block 1625, the other circuit carrier 1080 is demounted from either the first waveguide structure layer 230 or to the second waveguide structure layer 250. Block 1625 then terminates the method.

While the above representative embodiment has been described in terms of a radial power combiner 300, it will be understood by one of ordinary skill in the art that other representative embodiments can be implemented using the disclosures herein.

In a representative embodiment, an electronic system 100 is disclosed. The electronic system 100 comprises a waveguide structure 110 having a first waveguide-coupling point 111 and a second waveguide-coupling point 112 and an active electronic circuit 120 having a first circuit-coupling point 121 and a second circuit-coupling point 122. The second waveguide-coupling point 112 is coupled to the first circuit-coupling point 121; the system 100 is capable of receiving an input signal 130 at the first waveguide-coupling point 111 and transmitting an output signal 140 at the second circuit-coupling point 122 and/or receiving the input signal 130 at the second circuit-coupling point 122 and transmitting the output signal 140 at the first waveguide-coupling point 111; the input signal 130 and the output signal 140 have frequencies 610 in a terahertz frequency range; and the system 100 is fabricated as a monolithic integrated structure having the waveguide structure 110 fabricated by micromachining and the circuit 120 fabricated monolithically.

In another representative embodiment, a method 1100 for fabricating an electronic system 100 is disclosed. The method 1100 comprises monolithically fabricating a waveguide structure 110 having a first waveguide-coupling point 111 and a second waveguide-coupling point 112 using micromachining techniques, monolithically fabricating an active electronic circuit 120 having a first circuit-coupling point 121 and a second circuit-coupling point 122, and monolithically attaching the waveguide structure 110 to the active electronic circuit 120. The second waveguide-coupling point 112 is coupled to the first circuit-coupling point 121; the system 100 is capable of receiving an input signal 130 at the first waveguide-coupling point 111 and transmitting an output signal 140 at the second circuit-coupling point 122 and/or receiving the input signal 130 at the second circuit-coupling point 122 and transmitting the output signal 140 at the first waveguide-coupling point 111; the input signal 130 and the output signal 140 have frequencies 610 in a terahertz frequency range; and the system 100 is fabricated as a monolithic integrated structure having the waveguide structure 110 fabricated by micromachining and the circuit 120 fabricated monolithically.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. An electronic system, comprising:
a waveguide structure having a first waveguide-coupling point and a second waveguide-coupling point;
an active electronic circuit having a first circuit-coupling point and a second circuit-coupling point,
   wherein the second waveguide-coupling point is coupled to the first circuit-coupling point,
   wherein the system is capable of receiving an input signal at the first waveguide-coupling point and transmitting an output signal at the second circuit-coupling point and/or receiving the input signal at the second circuit-coupling point and transmitting the output signal at the first waveguide-coupling point,
   wherein the input signal and the output signal have frequencies in a terahertz frequency range,
   wherein the system is fabricated as a monolithic integrated structure having the waveguide structure fabricated by micromachining and the circuit fabricated monolithically,
   wherein the waveguide structure is batch process fabricated on a substrate as a waveguide structure layer, and
   wherein the active electronic circuit is batch process fabricated on another substrate as a circuit layer; and
an input layer or an output layer,
   wherein the input or output layer is batch process fabricated on additional substrate,
   wherein the input or output layer is capable of coupling signals to and/or from the electronic system, and
   wherein the circuit layer either overlays the waveguide structure layer and the waveguide structure layer overlays the input layer or the circuit layer underlies the waveguide structure layer and the waveguide structure layer underlies the output layer.

2. The electronic system as recited in claim 1, further comprising:
at least one conductive probe disposed on the input layer or the output layer,
   wherein, as appropriate, electrical coupling between the input layer or the output layer and the waveguide structure layer is enabled by each conductive probe disposed on the input layer or the output layer and coupled to features on the input layer or the output layer and to associated features on the waveguide structure layer; and
at least one conductive probe disposed on the circuit layer,
   wherein electrical coupling between the circuit layer and the waveguide structure layer is enabled by each conductive probe disposed on the circuit layer and coupled to features on the circuit layer and to associated features on the waveguide structure layer.

3. The electronic system as recited in claim 1,
wherein with the various layers in wafer form the waveguide structure layer is bonded to the input layer or to the output layer and the circuit layer is bonded to the waveguide structure layer.

4. An electronic system, comprising:
a waveguide structure having a first waveguide-coupling point and a second waveguide-coupling point;
an active electronic circuit having a first circuit-coupling point and a second circuit-coupling point,
   wherein the second waveguide-coupling point is coupled to the first circuit-coupling point,
   wherein the system is capable of receiving an input signal at the first waveguide-coupling point and transmitting an output signal at the second circuit-coupling point and/or receiving the input signal at the second circuit-coupling point and transmitting the output signal at the first waveguide-coupling point,
   wherein the input signal and the output signal have frequencies in a terahertz frequency range,
   wherein the system is fabricated as a monolithic integrated structure having the waveguide structure fabricated by micromachining and the circuit fabricated monolithically,
   wherein the waveguide structure is batch process fabricated on a substrate as a waveguide structure layer, and
   wherein the active electronic circuit is batch process fabricated on another substrate as a circuit layer;
an input layer and an output layer; and
an additional waveguide structure layer,
   wherein the input and output layers are batch process fabricated on substrates,
   wherein the input and output layers are capable of coupling signals to and/or from the electronic system, and
   wherein the waveguide structure layer overlays the input layer, the circuit layer overlays the waveguide structure layer, the additional waveguide structure layer overlays the circuit layer, and the output layer overlays the additional waveguide structure layer.

5. The electronic system as recited in claim 4,
wherein the system is a radial power combiner,
wherein each waveguide structure layer has a waveguide structure cavity etched into it,
wherein the cavity in the waveguide structure layer is coupled to the input layer and to multiple amplifier circuits on the circuit layer, and
wherein the cavity in the additional waveguide structure layer is coupled to the output layer and to the multiple amplifier circuits on the circuit layer.

6. The electronic system as recited in claim 4, further comprising:
at least one conductive probe disposed on the input layer,
   wherein electrical coupling between the input layer and the waveguide structure layer is enabled by each conductive probe disposed on the input layer and coupled to features on the input layer and to associated features on the waveguide structure layer;
at least one conductive probe disposed on the circuit layer,
   wherein electrical coupling between the circuit layer and the waveguide structure layer is enabled by each conductive probe disposed on the circuit layer and coupled to features on the circuit layer and to associated features on the waveguide structure layer and wherein electrical coupling between the circuit layer and the additional waveguide structure layer is enabled by each conductive probe disposed on the circuit layer and coupled to features on the circuit layer and to associated features on the additional waveguide structure layer; and at least one conductive probe disposed on the output layer, wherein electrical coupling between the output layer and the additional waveguide structure layer is enabled by each conductive probe disposed on the output layer and coupled to features on the output layer and to associated features on the additional waveguide structure layer.

7. The electronic system as recited in claim 4, wherein with the various layers in wafer form the waveguide structure layer is bonded to the input layer, the circuit layer is bonded to the waveguide structure layer, the additional waveguide structure layer is bonded to the circuit layer, and the output layer is bonded to the additional waveguide structure layer.

8. An electronic system, comprising:
a waveguide structure having a first waveguide-coupling point and a second waveguide-coupling point;
an active electronic circuit having a first circuit-coupling point and a second circuit-coupling point,
  wherein the second waveguide-coupling point is coupled to the first circuit-coupling point,
  wherein the system is capable of receiving an input signal at the first waveguide-coupling point and transmitting an output signal at the second circuit-coupling point and/or receiving the input signal at the second circuit-coupling point and transmitting the output signal at the first waveguide-coupling point,
  wherein the input signal and the output signal have frequencies in a terahertz frequency range,
  wherein the system is fabricated as a monolithic integrated structure having the waveguide structure fabricated by micromachining and the circuit fabricated monolithically,
  wherein the waveguide structure is batch process fabricated on a substrate as a waveguide structure layer, and
  wherein the active electronic circuit is batch process fabricated on another substrate as a circuit layer;
a spacer layer,
  wherein the spacer layer is batch process fabricated on a spacer substrate; and
an input layer or an output layer,
  wherein the input or output layer is batch process fabricated on an additional substrate,
  wherein the input or output layer is capable of coupling signals to and/or from the electronic system, and
  wherein either the spacer layer overlays the input layer, the waveguide structure layer overlays the spacer layer, and the circuit layer overlays the waveguide structure layer or the waveguide structure layer overlays the circuit layer, the spacer layer overlays the waveguide structure layer, and the output layer underlies the spacer layer.

9. The electronic system as recited in claim 8, further comprising:
at least one conductive probe disposed on the input layer or the output layer,
  wherein, as appropriate, electrical coupling between the input layer or the output layer and the spacer layer is enabled by each conductive probe disposed on the input layer or the output layer and coupled to features on the input layer or the output layer and to associated features on the spacer layer;
at least one conductive probe disposed on the spacer layer,
  wherein, electrical coupling between the spacer layer and the waveguide structure layer is enabled by each conductive probe disposed on the spacer layer and coupled to features on the spacer layer and to associated features on the waveguide structure layer; and
at least one conductive probe disposed on the circuit layer,
  wherein electrical coupling between the circuit layer and the waveguide structure layer is enabled by each conductive probe disposed on the circuit layer and coupled to features on the circuit layer and to associated features on the waveguide structure layer.

10. The electronic system as recited in claim 8, wherein with the various layers in wafer form the spacer layer is bonded to the input layer or the output layer, the waveguide structure layer is bonded to the spacer layer, and the circuit layer is bonded to the waveguide structure layer.

11. An electronic system, comprising:
a waveguide structure having a first waveguide-coupling point and a second waveguide-coupling point;
an active electronic circuit having a first circuit-coupling point and a second circuit-coupling point,
  wherein the second waveguide-coupling point is coupled to the first circuit-coupling point,
  wherein the system is capable of receiving an input signal at the first waveguide-coupling point and transmitting an output signal at the second circuit-coupling point and/or receiving the input signal at the second circuit-coupling point and transmitting the output signal at the first waveguide-coupling point,
  wherein the input signal and the output signal have frequencies in a terahertz frequency range,
  wherein the system is fabricated as a monolithic integrated structure having the waveguide structure fabricated by micromachining and the circuit fabricated monolithically,
  wherein the waveguide structure is batch process fabricated on a substrate as a waveguide structure layer, and
  wherein the active electronic circuit is batch process fabricated on another substrate as a circuit layer;
a first spacer layer;
a second spacer layer
  wherein the first and the second spacer layers are batch process fabricated on separate spacer substrates;
an input layer and an output layer,
  wherein the input and output layers are batch process fabricated on separate substrates; and
an additional waveguide structure layer,
  wherein the input and output layers are capable of coupling signals to and/or from the electronic system,
  wherein the first spacer layer overlays the input layer, the waveguide structure layer overlays the first spacer layer, and the circuit layer overlays the waveguide structure layer, and
  wherein the additional waveguide structure layer overlays the circuit layer, the second spacer layer overlays the additional waveguide structure layer, and the output layer overlays the second spacer layer.

12. The electronic system as recited in claim 11,
wherein the system is a radial power combiner,
wherein each waveguide structure layer has a waveguide structure cavity etched into it,
wherein the cavity in the waveguide structure layer is coupled to the input layer and to multiple amplifier circuits on the circuit layer, and
wherein the cavity in the additional waveguide structure layer is coupled to the output layer and to the multiple amplifier circuits on the circuit layer.

13. The electronic system as recited in claim 11, further comprising:
at least one conductive probe disposed on the input layer,
wherein electrical coupling between the input layer and the first spacer layer is enabled by each conductive probe disposed on the input layer and coupled to features on the input layer and to associated features on the first spacer layer;
at least one conductive probe disposed on the first spacer layer,
wherein, electrical coupling between the first spacer layer and the waveguide structure layer is enabled by each conductive probe disposed on the first spacer layer and coupled to features on the first spacer layer and to associated features on the waveguide structure layer;
at least one conductive probe disposed on the circuit layer,
wherein electrical coupling between the circuit layer and the waveguide structure layer is enabled by each conductive probe disposed on the circuit layer and coupled to features on the circuit layer and to associated features on the waveguide structure layer and
wherein electrical coupling between the circuit layer and the additional waveguide structure layer is enabled by each conductive probe disposed on the circuit layer and coupled to features on the circuit layer and to associated features on the additional waveguide structure layer;
at least one conductive probe disposed on the second spacer layer,
wherein, electrical coupling between the second spacer layer and the additional waveguide structure layer is enabled by each conductive probe disposed on the second spacer layer and coupled to features on the second spacer layer and to associated features on the additional waveguide structure layer; and
at least one conductive probe disposed on the output layer,
wherein electrical coupling between the output layer and the additional waveguide structure layer is enabled by each conductive probe disposed on the output layer and coupled to features on the output layer and to associated features on the additional waveguide structure layer.

14. The electronic system as recited in claim 11,
wherein with the various layers in wafer form the first spacer layer is bonded to the input layer, the waveguide structure layer is bonded to the first spacer layer, the circuit layer is bonded to the waveguide structure layer, the additional waveguide structure layer is bonded to the circuit layer, the second spacer layer is bonded to the additional waveguide structure layer, and the output layer is bonded to the second spacer layer.

* * * * *